(12) United States Patent
Chen

(10) Patent No.: US 12,310,178 B2
(45) Date of Patent: May 20, 2025

(54) DISPLAY PANEL AND DISPLAY DEVICE FOR VOIDING FIXED GRATING IN LIGHT-TRANSMISSIVE REGIONS

(71) Applicant: Hubei Yangtze Industrial Innovation Center Of Advanced Display Co., Ltd., Wuhan (CN)

(72) Inventor: Liqun Chen, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 374 days.

(21) Appl. No.: 17/810,614

(22) Filed: Jul. 4, 2022

(65) Prior Publication Data

US 2022/0336548 A1    Oct. 20, 2022

(30) Foreign Application Priority Data

Dec. 31, 2021 (CN) .......................... 202111667756.8

(51) Int. Cl.
*H10K 59/121* (2023.01)
*H10K 59/60* (2023.01)
*H10K 59/65* (2023.01)

(52) U.S. Cl.
CPC ........... *H10K 59/121* (2023.02); *H10K 59/60* (2023.02); *H10K 59/65* (2023.02)

(58) Field of Classification Search
CPC ............................... H10K 59/60; H10K 59/65
USPC ....................................................... 257/40
See application file for complete search history.

(56) References Cited

U.S. PATENT DOCUMENTS

| 9,312,312 B1* | 4/2016 | Tsai ................. H10K 59/121 |
| 11,567,311 B1* | 1/2023 | Qiao ................ G02B 26/023 |
| 2012/0280215 A1* | 11/2012 | Choi ............... H10K 59/121 |
| | | 257/40 |
| 2014/0307430 A1* | 10/2014 | Lo ....................... G09F 9/30 |
| | | 362/231 |
| 2019/0250450 A1* | 8/2019 | Li ..................... G02F 1/1306 |
| 2019/0319079 A1* | 10/2019 | Xing .................. G09G 3/3225 |

(Continued)

FOREIGN PATENT DOCUMENTS

| CN | 106094087 A | 11/2016 |
| CN | 106772732 A | 5/2017 |

(Continued)

*Primary Examiner* — Sheng-Bai Zhu
(74) *Attorney, Agent, or Firm* — KILPATRICK TOWNSEND & STOCKTON LLP

(57) ABSTRACT

The display panel includes a display region, where at least a portion of the display region is a transparent display region including a plurality of sub-regions, where the plurality of sub-regions are arranged in an array and have the same shape and the same area. A sub-region of the plurality of sub-regions includes a first side and a second side which are adjacent to each other. The sub-region includes a non-light-transmissive region and a light-transmissive region. A distance between a center of the light-transmissive region and a first side of a sub-region where the light-transmissive region is located is $d_1$, a distance between the center of the light-transmissive region and a second side of the sub-region where the light-transmissive region is located is $d_2$, and at least two of the plurality of sub-regions have at least one of different $d_1$ or different $d_2$.

18 Claims, 21 Drawing Sheets

(56) References Cited

U.S. PATENT DOCUMENTS

2020/0211443 A1* 7/2020 Zeng .................... G09G 3/3208
2020/0328373 A1* 10/2020 Huang ................. H10K 50/868
2021/0134889 A1* 5/2021 Zhang ................... H10K 59/65

FOREIGN PATENT DOCUMENTS

| CN | 109448575 A | | 3/2019 |
|---|---|---|---|
| CN | 110783390 | * | 2/2020 |
| CN | 112687193 | * | 4/2021 |
| CN | 113140591 A | | 7/2021 |

* cited by examiner

DISPLAY PANEL AND DISPLAY DEVICE FOR VOIDING FIXED GRATING IN LIGHT-TRANSMISSIVE REGIONS

CROSS-REFERENCE TO RELATED APPLICATION(S)

This application claims priority to Chinese patent application No. 202111667756.8 filed Dec. 31, 2021, the disclosure of which is incorporated herein by reference in its entirety.

FIELD

Embodiments of the present disclosure relate to display technology and, in particular, to a display panel and a display device.

BACKGROUND

With the development of display technology, various new types of display technology are emerging, such as a display screen provided with an under-screen camera and a transparent display screen for window display. Currently, there are related products in the market.

In the display screen provided with the under-screen camera or the display screen for transparent display, a corresponding transparent display region needs to be disposed, and light-transmissive holes are disposed in the transparent display region to achieve light transmission. In order to avoid an effect on normal display, relatively many light-transmissive holes each having a relatively small size are provided. When light is transmitted through the light-transmissive holes, light diffraction is easy to occur, which affects the display effect of the transparent display screen or blurs an image captured by the camera.

SUMMARY

One embodiments of the present disclosure provide a display panel. The display panel includes a display region, where at least a portion of the display region is a transparent display region.

The transparent display region includes a plurality of sub-regions, where the plurality of sub-regions are arranged in an array and have the same shape and the same area. A sub-region of the plurality of sub-regions includes a first side and a second side which are adjacent to each other, where a first side of a certain sub-region also serves as a certain side of an adjacent sub-region in a first direction, and a second side of the certain sub-region also serves as a certain side of an adjacent sub-region in a second direction, where the first direction intersects with the second direction, and the first direction intersects with the first side.

The sub-region includes a non-light-transmissive region and a light-transmissive region, where light-transmissive regions in the plurality of sub-regions have the same shape. A distance between a center of the light-transmissive region and a first side of a sub-region where the light-transmissive region is located is $d_1$, a distance between the center of the light-transmissive region and a second side of the sub-region where the light-transmissive region is located is $d_2$, and at least two of the plurality of sub-regions have at least one of different $d_1$ or different $d_2$.

Some embodiments of the present disclosure further provide a display device. The display device includes the above display panel.

DETAILED DESCRIPTION

Figure 1:
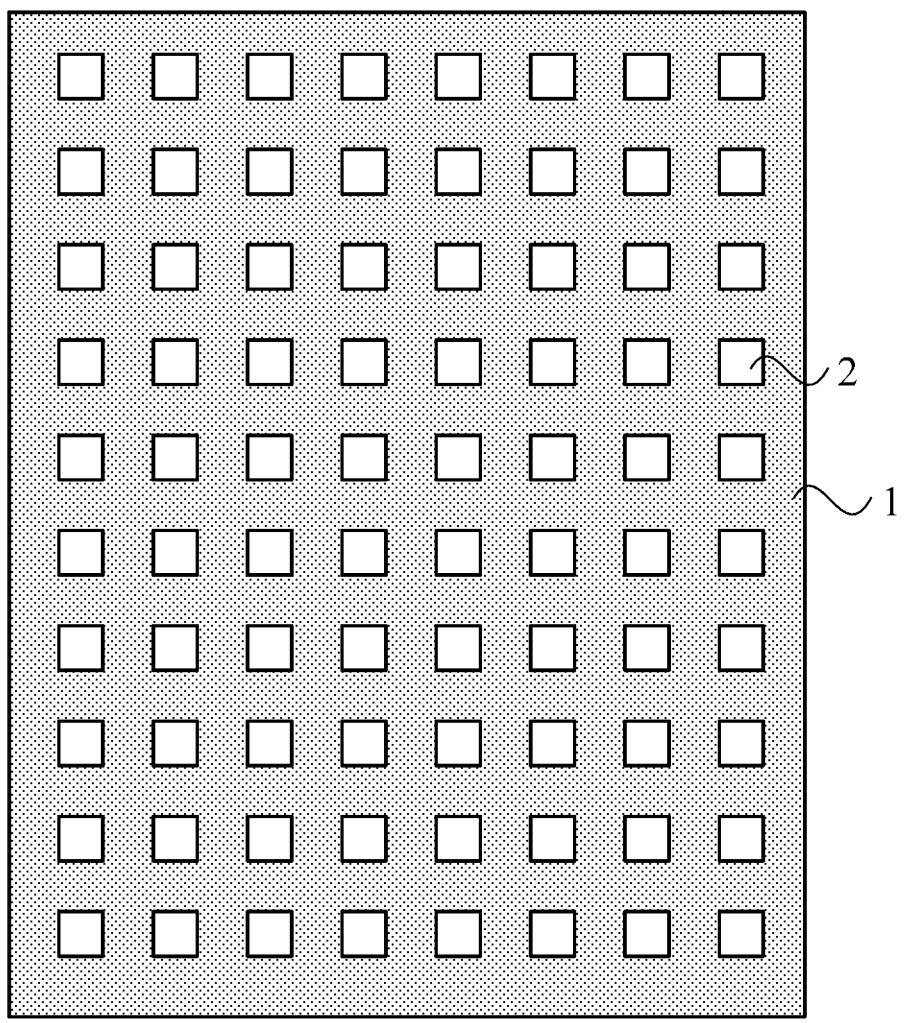
FIG. 1 is a structure diagram of a display panel in the related art.

The present disclosure is further described hereinafter in detail in conjunction with drawings and embodiments. It is to be understood that the embodiments described herein are intended to explain the present disclosure and not to limit the present disclosure. Additionally, it is to be noted that for ease of description, only part, not all, of structures related to the present disclosure are illustrated in the drawings.

Terms used in the embodiments of the present disclosure are only used to describe particular embodiments and not intended to limit the present disclosure. It is to be noted that nouns of locality, such as "on", "below", "left" and "right", used in the embodiments of the present disclosure, are described from the angles illustrated in the drawings and are not to be construed as limitations to the embodiments of the present disclosure. Additionally, in the context, it is to be understood that when an element is formed "on" or "below" another element, the element may be directly formed "on" or "below" the other element or may be indirectly formed "on" or "below" the other element via an intermediate element. The terms "first", "second" and the like are only used for description and used to distinguish between different components rather than indicate any order, quantity or importance. The specific meanings of the preceding terms in the present disclosure can be construed according to specific situations.

FIG. 1 is a structure diagram of a display panel in the related art. Referring to FIG. 1, the display panel is a transparent display panel and includes a display region 1. For transparent display of the display panel, a plurality of light-transmissive holes 2 are arranged in the display region 1, where ambient light can be transmitted through the plurality of light-transmissive holes 2. Since the plurality of light-transmissive holes 2 are arranged in an array, the plurality of light-transmissive holes 2 may be regarded as a two-dimensional grating. When light is transmitted through the plurality of light-transmissive holes 2, relatively severe diffraction will cause blurry display. Some solutions in the related art are to reduce the diffraction through varies of shapes, sizes or the like of the light-transmissive holes, which, however, may greatly affect the uniformity of light and affect a transparent display effect.

To solve the above problems, the embodiments of the present disclosure provide a display panel. The display panel includes a display region, where at least a portion of the display region is a transparent display region. The transparent display region includes a plurality of sub-regions, where the plurality of sub-regions are arranged in an array and have the same shape and the same area. Each sub-region includes a first side and a second side which are adjacent to each other, where a first side of a certain sub-region also serves as a certain side of an adjacent sub-region in a first direction, and a second side of the certain sub-region also serves as a certain side of an adjacent sub-region in a second direction, where the first direction intersects the second direction, and the first direction intersects with the first side. Each sub-region includes a non-light-transmissive region and a light-transmissive region, where light-transmissive regions in the plurality of sub-regions have the same shape. A distance between a center of the light-transmissive region and a first side of a sub-region where the light-transmissive region is located is $d_1$, a distance between the center of the light-transmissive region and a second side of the sub-region where the light-transmissive region is located is $d_2$, and at least two sub-regions have at least one of different $d_1$ or different $d_2$.

A type of the display panel and a manner in which the light-transmissive regions are formed are not limited in the embodiments of the present disclosure. For example, the display panel may be a display panel based on an organic light-emitting diode (OLED), a display panel based on a micro light-emitting diode (micro-LED) or a display panel in which two or more types of light-emitting element are integrated. The light-transmissive regions may be formed through punches in a light shielding layer, through punches in a black pixel defining layer or in other manners. The light-emitting element is disposed in the non-light-transmissive region, and its specific position may be designed according to an actual situation.

Figure 2:
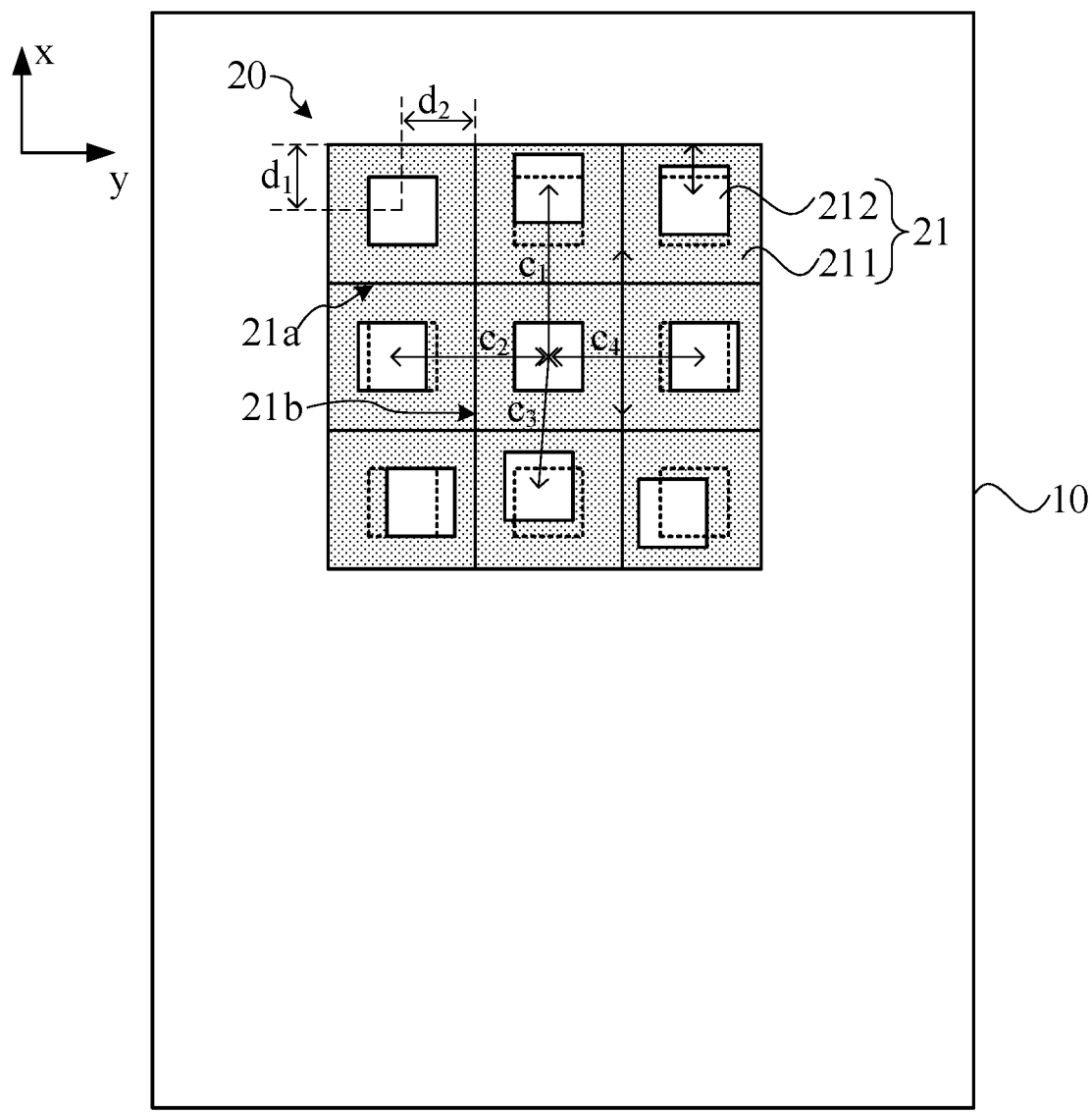
FIG. 2 is a structure diagram of a display panel according to an embodiment of the present disclosure.

In an embodiment, FIG. 2 is a structure diagram of a display panel according to an embodiment of the present disclosure. Referring to FIG. 2, the display panel includes a display region 10 which includes a transparent display region 20. It is only illustrative that the transparent display region 20 shown in FIG. 2 is only a portion of the display region 10. In other embodiments, all the display region 10 may be the transparent display region. The transparent display region 20 includes a plurality of sub-regions 21 which are arranged in an array and have the same shape and the same area. Illustratively, FIG. 2 shows that each sub-region 21 is rectangular in shape, and the shape may be designed according to an actual condition. The sub-region 21 includes a first side 21a (an upper side of a rectangle) and a second side 21b (a right side of the rectangle) which are adjacent to each other. The first side 21a also serves as a certain side (a lower side of an upper rectangle) of an adjacent sub-region 21 in a first direction x, and the second side 21b also serves as a certain side (a left side of a right rectangle) of an adjacent sub-region 21 in a second direction y, that is, the transparent display region 20 is formed by the plurality of sub-regions 21 which are densely arranged and spliced. The first direction x intersects with the second direction y, and the first direction x intersects with the first side 21a. Each sub-region 21 includes a non-light-transmissive region 211 and a light-transmissive region 212, where light-transmissive regions 212 have the same shape. Light tends to be transmitted consistently through each light-transmissive region 212, which is conducive to improving light transmission uniformity. Illustratively, FIG. 2 shows that the light-transmissive regions 212 also have the same area. It can be ensured that the light-transmissive regions 212 are distributed according to a designable maximum area, which is conducive to improving transmittance. In other embodiments, at least some light-transmissive regions 212 may have the same shape and different areas, that is, the light-transmissive regions 212 are similar. The different areas of the light-transmissive regions 212 can improve randomness of the design of the light-transmissive regions 212 and further reduce light diffraction. A distance between a center of the light-transmissive region 212 and a first side 21a of a sub-region 21 where the light-transmissive region 212 is located is $d_1$, and a distance between the center of the light-transmissive region 212 and a second side of the sub-region 21 where the light-transmissive region 212 is located is $d_2$. In the present embodiment, at least two sub-regions 21 have at least one of different $d_1$ or different $d_2$, that is, for two different sub-regions, $d_1$ may have different values, $d_2$ may have different values, or both $d_1$ and $d_2$ may be designed to have different values. Such design can avoid a periodic grating in the light-transmissive regions 212. In an embodiment, FIG. 2 illustratively shows that the transparent display region 20 includes 9 sub-regions, where $d_1$ is different for three sub-regions in the first row, $d_2$ is different for three sub-regions in the first column, and both $d_1$ and $d_2$ are different for the sub-region in the second column of the first row and the sub-region in the first column of the second row. In the embodiment shown in FIG. 2, a center of the sub-region 21 in the first column of the first row coincides with a center of the corresponding light-transmissive region 212, and a center of the sub-region 21 in the second column of the second row coincides with a center of the corresponding light-transmissive region 212. When at least one of $d_1$ and $d_2$ is different, the center of the light-transmissive region may be regarded as being deviated. The dashed box in FIG. 2 shows a contour of the light-transmissive region located at the center of the sub-region. When the light-transmissive region moves in a positive direction or a negative direction of the x-direction, $d_1$ varies; when the light-transmissive region moves in a positive direction or a negative direction of the y-direction, $d_2$ varies; and when the light-transmissive region moves in both the x-direction and the y-direction, both $d_1$ and $d_2$ vary. In a specific implementation, the values of $d_1$ and the values of $d_2$ may be randomly set within allowable ranges, that is, the light-transmissive regions may be randomly distributed in the display region according to no particular rule, to avoid a grating in a plurality of light-transmissive regions.

Figure 3:
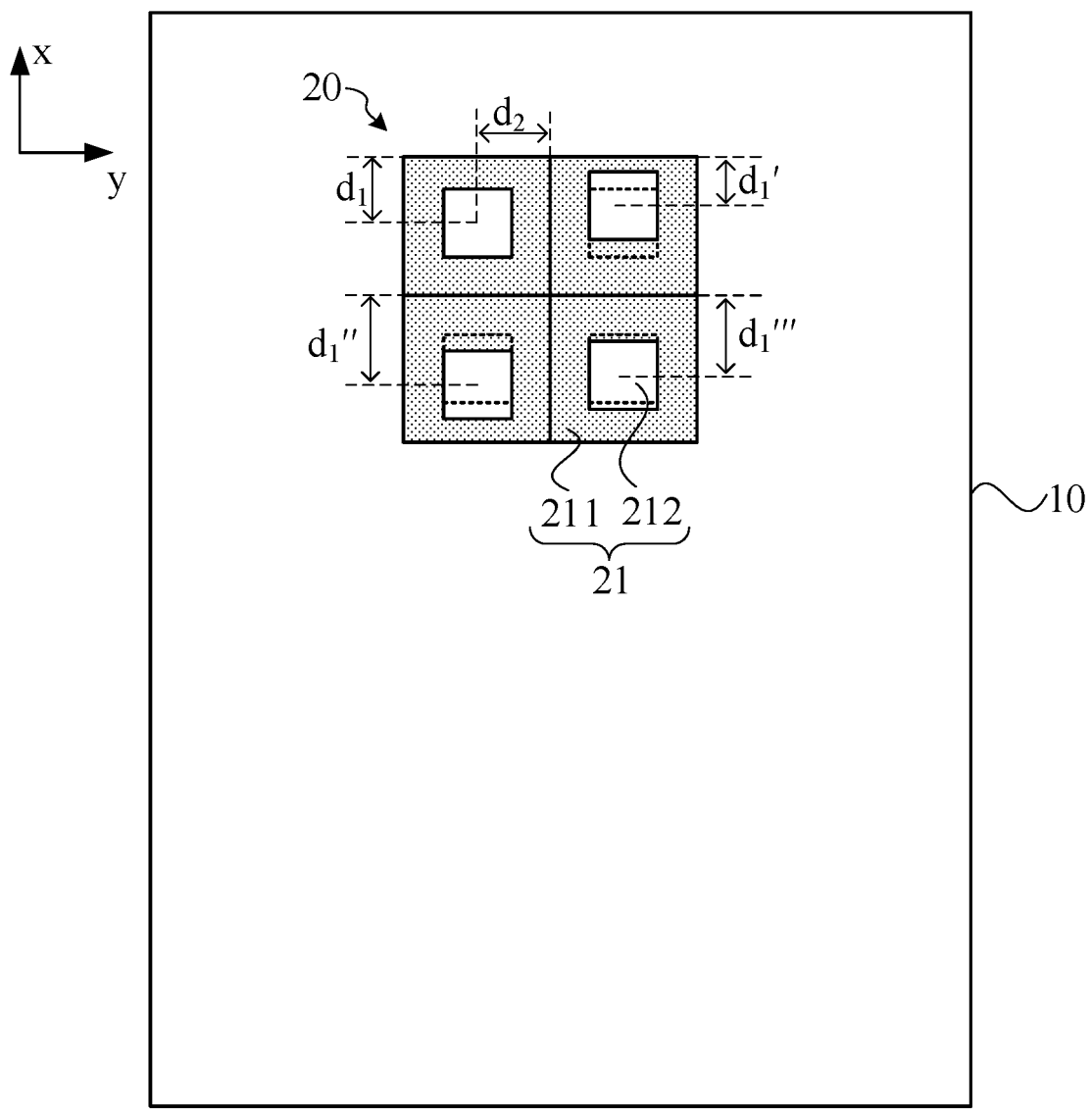
FIG. 3 is a structure diagram of another display panel according to an embodiment of the present disclosure.
Figure 4:
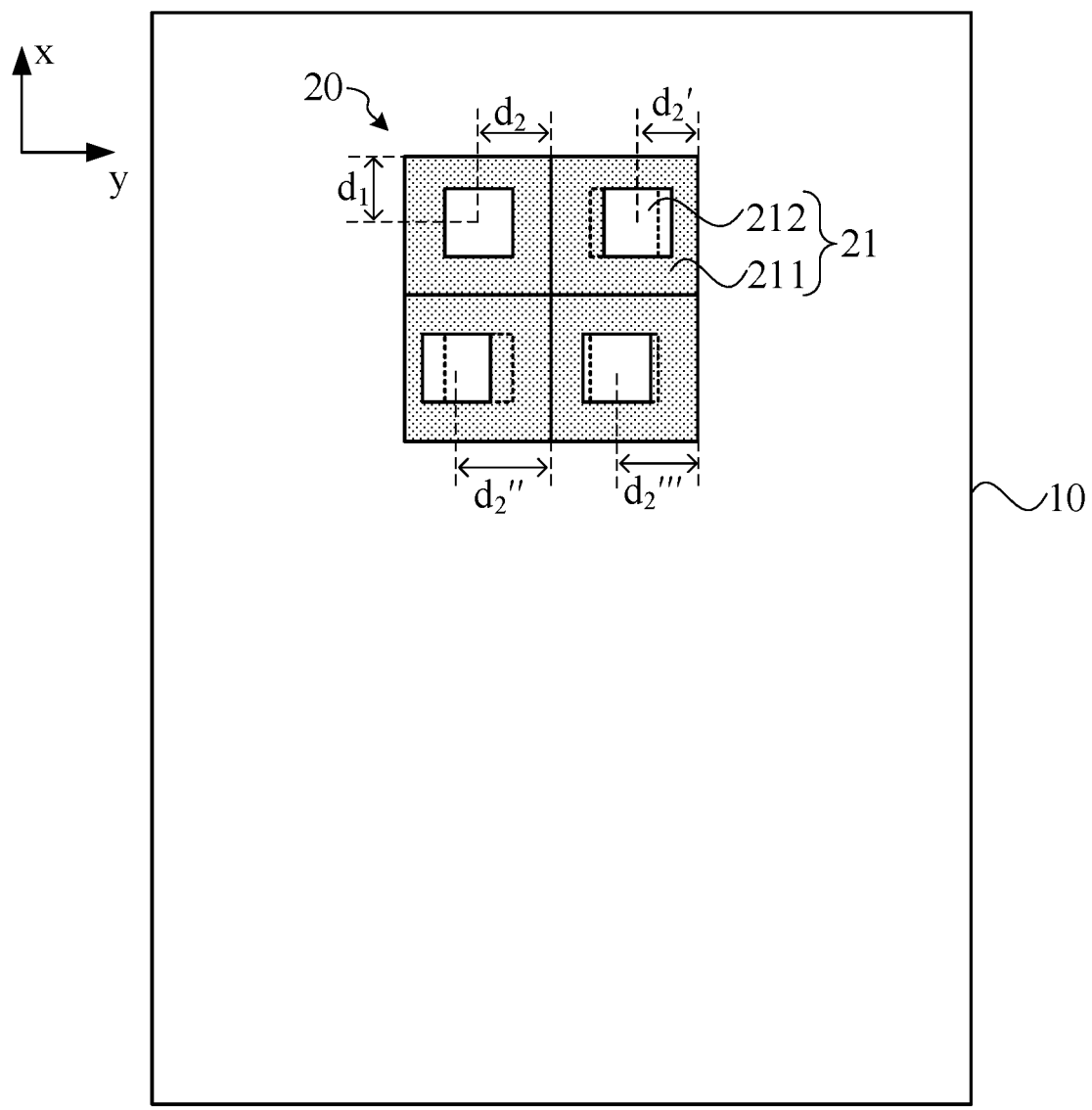
FIG. 4 is a structure diagram of another display panel according to an embodiment of the present disclosure.
Figure 5:
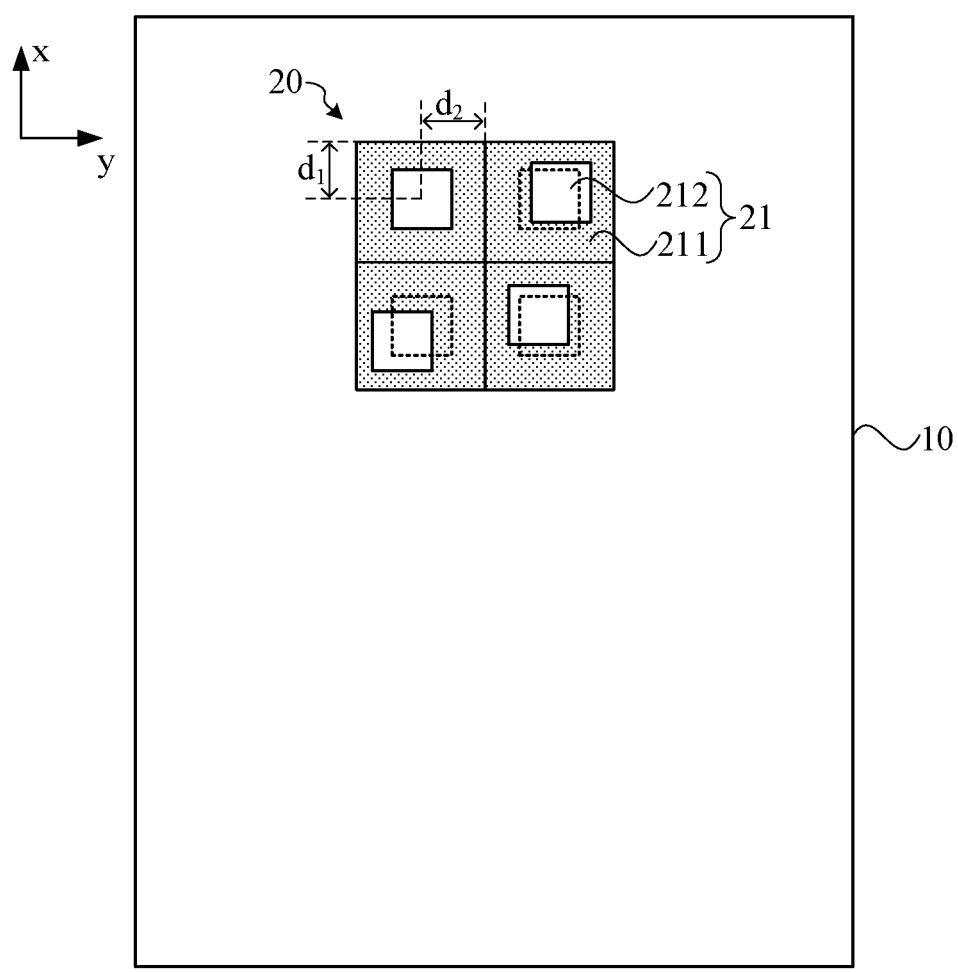
FIG. 5 is a structure diagram of another display panel according to an embodiment of the present disclosure.

In other embodiments, it may be set that only $d_1$ is different for at least two sub-regions 21, only $d_2$ is different for at least two sub-regions 21, both $d_1$ and $d_2$ are different for at least two sub-regions 21, or at least two of the above three cases are included (for example, FIG. 2 shows that all the above three cases are included), which may be designed according to an actual situation in a specific implementation. FIG. 3 is a structure diagram of another display panel according to an embodiment of the present disclosure. Using an example in which the transparent display region includes 4 sub-regions 21, referring to FIG. 3, $d_1$ is different for all the 4 sub-regions 21, where the light-transmissive region 212 in the sub-region 21 in the first column of the first row is located at the center of the sub-region 21 and $d_1$ remains unchanged; the light-transmissive region 212 in the sub-region 21 in the second column of the first row moves in the positive direction of the x-direction (moves upward) relative to the center of the sub-region 21 and $d_1'<d_1$; the light-transmissive region 212 in the sub-region 21 in the first column of the second row moves in the negative direction of the x-direction (moves downward) relative to the center of the sub-region 21 and $d_1''>d_1$; and the light-transmissive region 212 in the sub-region 21 in the second column of the second row moves in the negative direction of the x-direction (moves downward) relative to the center of the sub-region 21 and $d_1'''>d_1$. FIG. 4 is a structure diagram of another display panel according to an embodiment of the present disclosure. Referring to FIG. 4, $d_2$ is different for all the 4 sub-regions 21, where the light-transmissive region 212 in the sub-region 21 in the first column of the first row is located at the center of the sub-region 21 and $d_2$ remains unchanged; the light-transmissive region 212 in the sub-region 21 in the second column of the first row moves in the positive direction of the y-direction (moves right) relative to the center of the sub-region 21 and $d_2'<d_2$; the light-transmissive region 212 in the sub-region 21 in the first column of the second row moves in the negative direction of the y-direction (moves left) relative to the center of the sub-region 21 and $d_2''>d_2$; and the light-transmissive region 212 in the sub-region 21 in the second column of the second row moves in the negative direction of the y-direction (moves left) relative to the center of the sub-region 21 and $d_2'''<d_2$. FIG. 5 is a structure diagram of another display panel according to an embodiment of the present disclosure. Referring to FIG. 5, both $d_1$ and $d_2$ are different for all the 4 sub-regions 21. The light-transmissive regions in FIG. 5 are designed in a manner of superimposing the design rules of the light-transmissive regions in FIGS. 3 and 4, and the corresponding values of $d_1$ and $d_2$ after the light-transmissive regions move are not shown. That is, relative positions of the light-transmissive regions 212 in the sub-regions are changed and the light-transmissive regions can be randomly distributed and the light diffraction can be reduced. In other embodiments, $d_1$ and $d_2$ are set in a manner which is not limited to the above manners. In an embodiment, when the number of sub-regions is relatively large, the light-transmissive region that moves upward (or moves left) relative to the center of the sub-region and the light-transmissive region that moves downward (or moves right) relative to the center of the sub-region may both exist in the same row or the same column. In one embodiment, at least one of $d_1$ and $d_2$ may be designed to vary according to a preset rule, and when the light-transmissive regions are designed, the value of at least one of $d_1$ and $d_2$ may be randomly set with conditions satisfied.

Figure 6:
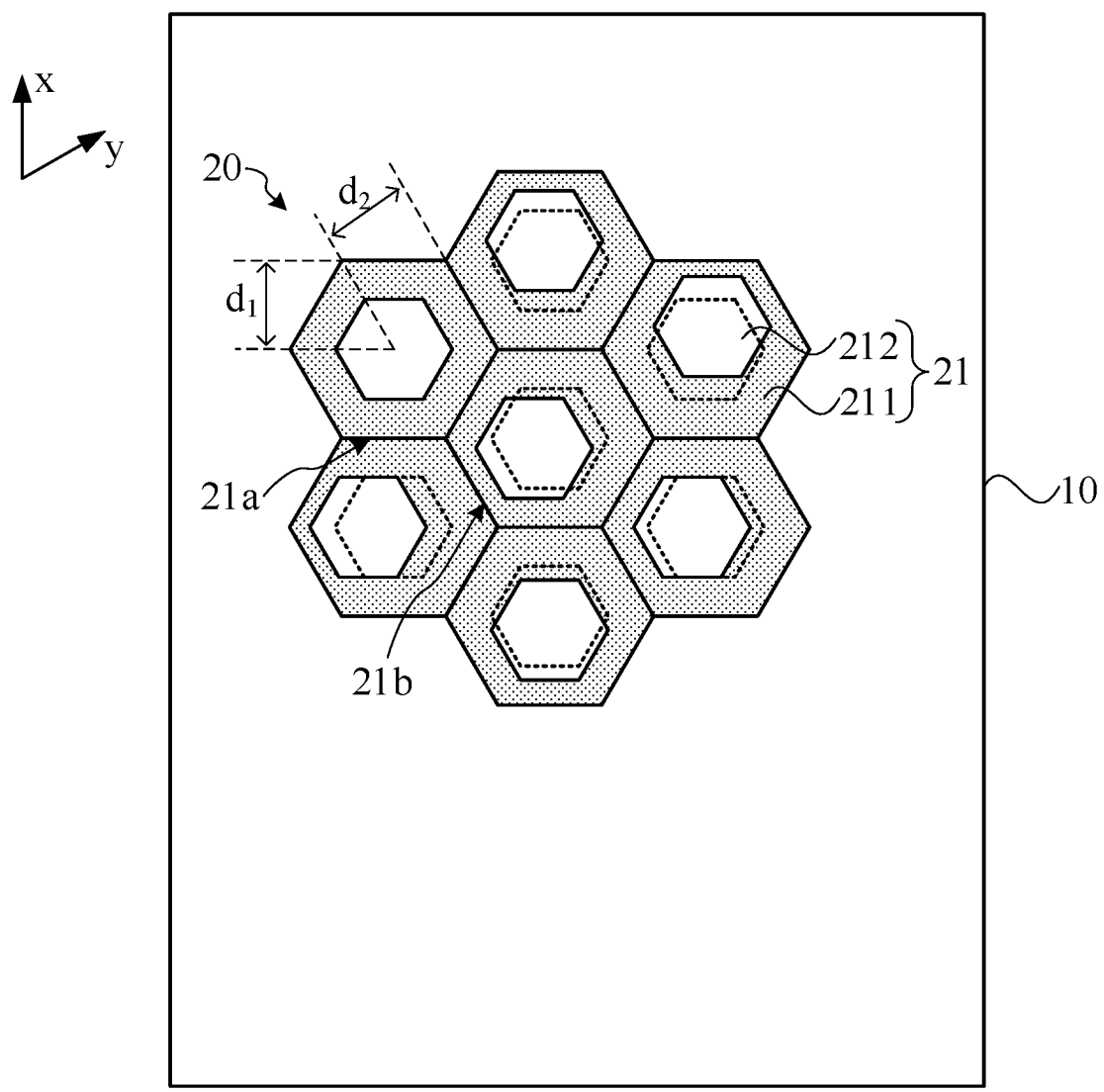
FIG. 6 is a structure diagram of another display panel according to an embodiment of the present disclosure.

It is to be noted that the shape of the sub-region in the preceding embodiments is only illustrative, and in other embodiments, the sub-region may be in other shapes, such as a hexagon and a triangle. The shape of the corresponding light-transmissive region is also not limited. For example, the light-transmissive region may also be in a shape such as a circle and an ellipse. In an embodiment, FIG. 6 is a structure diagram of another display panel according to an embodiment of the present disclosure. Referring to FIG. 6, in the present embodiment, the contour of each sub-region 21 and the contour of each light-transmissive region 212 are hexagonal in shape. At least one of $d_1$ and $d_2$ is different for at least two sub-regions, to improve the randomness of the distribution of the light-transmissive regions and reduce the diffraction when the light is transmitted through the light-transmissive regions.

According to the embodiments of the present disclosure, the transparent display region is disposed and the transparent display can be achieved. Alternatively, a photosensor is disposed in the transparent display region and full screen display can be achieved. The plurality of sub-regions are arranged in the transparent display region and include the light-transmissive regions which have the same shape and light transmission uniformity of the light-transmissive regions is improved. At least one of $d_1$ and $d_2$ is different for at least two sub-regions, which can avoid a fixed grating in the light-transmissive regions, reduce the diffraction when the light is transmitted through the light-transmissive regions, improve the display effect of the transparent display region or solve the problem of a poor quality of light received by an under-screen photosensor.

In an embodiment, distances between centers of two adjacent light-transmissive regions have at least two different values.

The transparent display region in the present embodiment includes the plurality of sub-regions densely spliced and arranged. The light-transmissive regions may be designed in the present embodiment according to an idea that centers of different light-transmissive regions are located in different positions of the sub-regions where the light-transmissive regions are located. Therefore, it may be set that the distance between the centers of two adjacent light-transmissive regions has at least two different values and the centers of the light-transmissive regions are randomly distributed within preset ranges of the sub-regions where the light-transmissive regions are located. It is to be understood that in some embodiments, when at least one of $d_1$ and $d_2$ has different values (in practice, $d_1$ may be different, $d_2$ may be different or both $d_1$ and $d_2$ may be different for two sub-regions), the distances between the centers of two adjacent light-transmissive regions at different positions may be the same. In an embodiment, in FIG. 2, the distances between the center of the light-transmissive region in the sub-region in the second column of the second row and the centers of the light-transmissive regions in four adjacent sub-regions are $c_1$, $c_2$, $c_3$ and $c_4$, respectively, where $c_2$ and $c_4$ are the same, and $c_1$, $c_2$ and $c_3$ are different. Although $c_2$ and $c_4$ are the same, $d_2$ is different for the first sub-region in the second row and the third sub-region in the second row. The positions of the light-transmissive regions may be specifically designed according to the positions of the centers of the light-transmissive regions or designed according to changes of the value of at least one of $d_1$ and $d_2$ as long as the periodic arrangement of the light-transmissive regions is reduced.

In an embodiment, at least two adjacent sub-regions have at least one of different $d_1$ or different $d_2$.

In an embodiment, with continued reference to FIG. 2, $d_1$ is different for the sub-region in the first column of the first row and the adjacent sub-region in the second column of the first row, $d_2$ is different for the sub-region in the first column of the first row and the adjacent sub-region in the first column of the second row, and both $d_1$ and $d_2$ are different for the sub-region in the second column of the third row and the adjacent sub-region in the third column of the third row. In other embodiments, it may be set that only $d_1$ is different for at least two adjacent sub-regions, only $d_2$ is different for two adjacent sub-regions, or both $d_1$ and $d_2$ are different for two adjacent sub-regions, which is conducive to improving the randomness of the distribution of the light-transmissive regions and reducing the diffraction when the number of sub-regions is relatively large. Further, any two adjacent sub-regions have at least one of different $d_1$ or different $d_2$, that is, for any two adjacent sub-regions, $d_1$ is different, $d_2$ is different, or both $d_1$ and $d_2$ are different, which is conducive to reducing the diffraction to a greater extent. In a specific implementation, the distribution of the light-transmissive regions may be designed according to an actual situation as long as the light-transmissive regions are randomly distributed or approximately randomly distributed.

In another embodiment, when the light-transmissive regions are designed, at least one of $d_1$ and $d_2$ may conform to a preset rule in a determined direction. In an embodiment, in at least one of the first direction and the second direction, $d_1$ in sub-regions varies according to a first rule, and/or $d_2$ in sub-regions varies according to a second rule. The first rule includes m different values of $d_1$, the second rule includes n different values of $d_2$, where m≥2, n≥2, and each of m and n is an integer.

In a specific implementation, $d_1$ may be designed to vary in the first direction according to the first rule, vary in the second direction according to the first rule, or vary in both the first direction and the second direction according to the first rule (which may be different specific rules in the first direction and the second direction); $d_2$ may be designed to vary in the first direction according to the second rule, vary in the second direction according to the second rule, or vary in both the first direction and the second direction according to the second rule (which may be different specific rules in the first direction and the second direction); $d_1$ may be designed to vary in the first direction according to the first rule, and at the same time, $d_2$ may be designed to vary in the first direction or the second direction according to the second rule or vary in both the first direction and the second direction according to the second rule; or $d_1$ may be designed to vary in the second direction according to the first rule, and at the same time, $d_2$ may be designed to vary in the first direction or the second direction according to the second rule or vary in both the first direction and the second direction according to the second rule. The first rule and the second rule may be designed according to an actual situation and are not limited in the embodiments of the present disclosure. In an embodiment, $d_1$ and $d_2$ may progressively increase or decrease by a fixed value or an unfixed value or vary at a fixed ratio or an unfixed ratio. In an embodiment, in the first rule, the m different values of $d_1$ are in an arithmetic progression, and/or in the second rule, the n different values of $d_2$ are in an arithmetic progression. In a specific implementation, the first rule and the second rule may be selected according to an actual situation. That is, the m different values of $d_1$ may be in an arithmetic progression, the n different values of $d_2$ may be in an arithmetic progression, or the m different values of $d_1$ may be in an arithmetic progression, and at the same time, the n different values of $d_2$ may be in an arithmetic progression, which may be flexibly selected according to an actual situation in a specific implementation.

Figure 7:
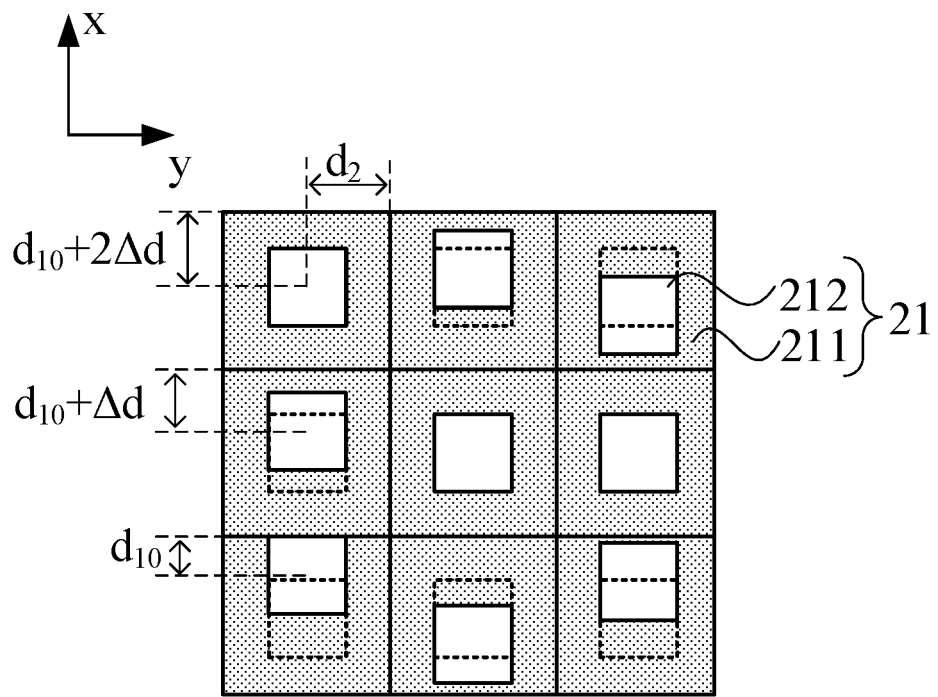
FIG. 7 is a structure diagram of a transparent display region according to an embodiment of the present disclosure.
Figure 8:
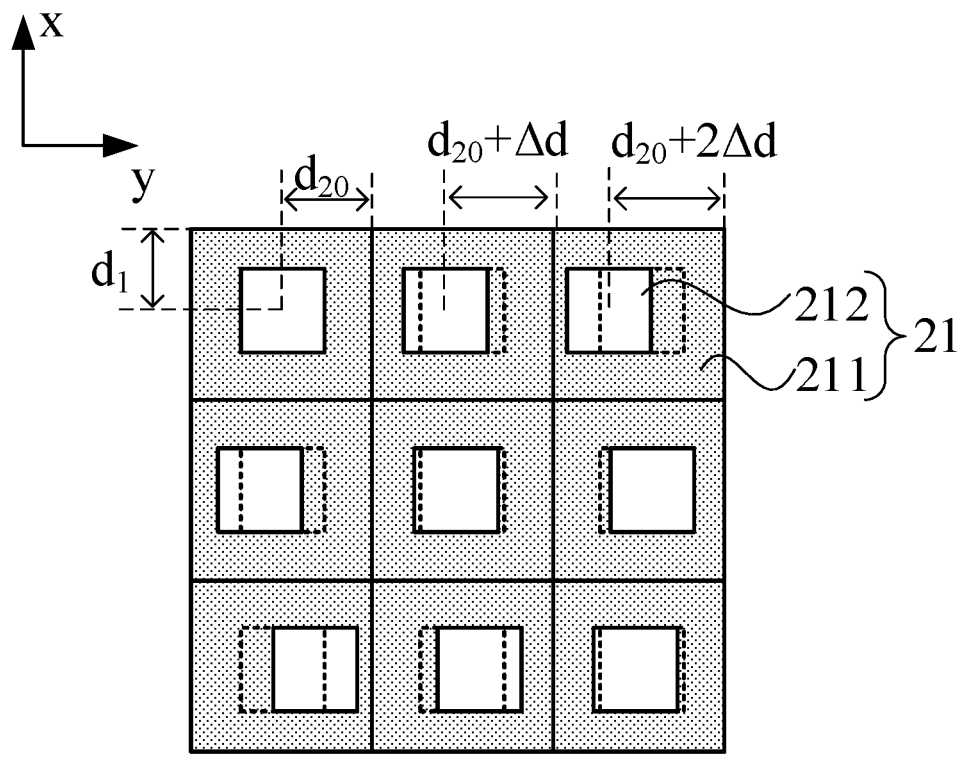
FIG. 8 is a structure diagram of another transparent display region according to an embodiment of the present disclosure.
Figure 9:
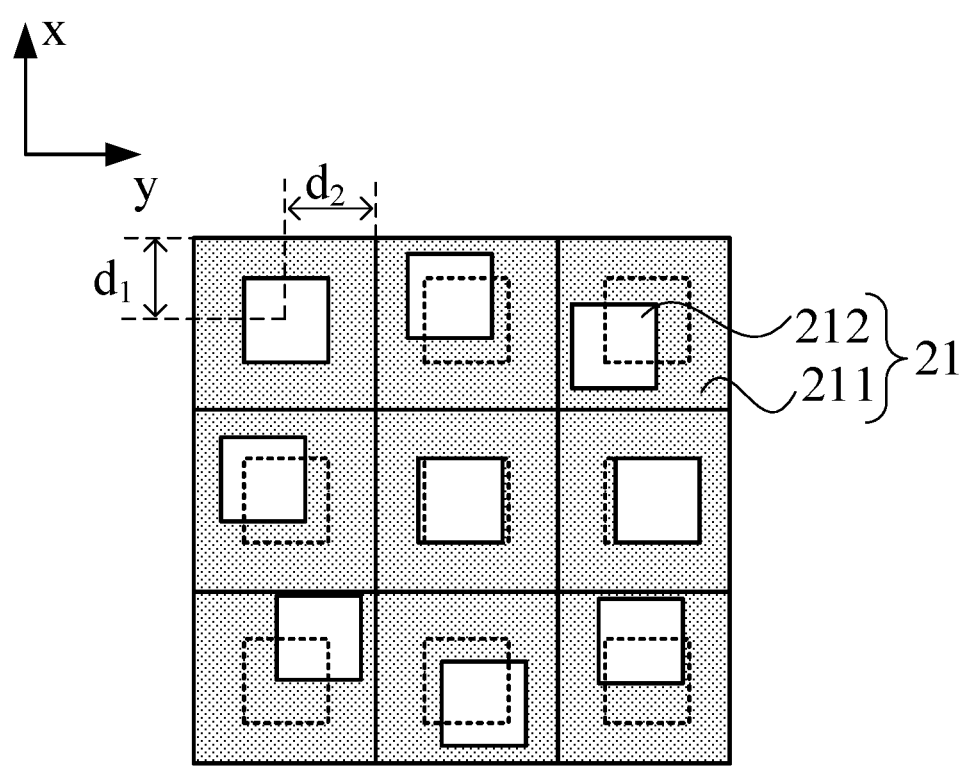
FIG. 9 is a structure diagram of another transparent display region according to an embodiment of the present disclosure.

In an embodiment, m=n=3 and the first rule and the second rule are varying according to arithmetic progressions. FIG. 7 is a structure diagram of a transparent display region according to an embodiment of the present disclosure. Referring to FIG. 7, in the first direction x (the column direction), $d_1$ in the sub-regions varies according to a rule of an arithmetic progression. In an embodiment, in the first direction x, $d_1$ in the sub-regions in the first column progressively increases in an arithmetic progression and $d_1$ in the sub-regions in the third column progressively increases in an arithmetic progression (for example, FIG. 7 shows that $d_1$ in the sub-regions in the first column are $d_{10}$, $d_{10}+\Delta d$ and $d_{10}+2\Delta d$, respectively, and $d_1$ in other sub-regions are not shown), and in the first direction x, $d_1$ in the sub-regions in the second column progressively decreases in an arithmetic progression, to reduce the diffraction in the light-transmissive regions. FIG. 8 is a structure diagram of another transparent display region according to an embodiment of the present disclosure. Referring to FIG. 8, in the second direction y (the row direction), $d_2$ in the sub-regions varies according to a rule of an arithmetic progression. In an embodiment, in the second direction y, $d_2$ in the sub-regions in the first row progressively increases in an arithmetic progression and $d_2$ in the sub-regions in the third row progressively increases in an arithmetic progression (for example, FIG. 8 shows that $d_2$ in the sub-regions in the first row are $d_{20}$, $d_{20}+\Delta d$ and $d_{20}+2\Delta d$, respectively, and $d_2$ in other sub-regions are not shown), and in the second direction y, $d_2$ in the sub-regions in the second row progressively decreases in an arithmetic progression, to reduce the diffraction in the light-transmissive regions. FIG. 9 is a structure diagram of another transparent display region according to an embodiment of the present disclosure. Referring to FIG. 9, in the first direction x, $d_1$ in the sub-regions varies according to the rule of the arithmetic progression, and in the second direction y, $d_2$ in the sub-regions also varies according to the rule of the arithmetic progression. The light-transmissive regions in FIG. 9 vary according to a rule of superimposing the variation rules of the light-transmissive regions in FIGS. 7 and 8, and the corresponding values of $d_1$ and $d_2$ after the light-transmissive regions move are not shown. In other embodiments, $d_1$ may vary in the second direction y, $d_2$ may vary in the first direction x, or both $d_1$ and $d_2$ may vary in the first direction x or the second direction y, which may be flexibly selected according to an actual situation in a specific implementation. At least one of $d_1$ and $d_2$ varies according to the preset rule and on the premise of ensuring that the light-transmissive regions are randomly arranged, the values of $d_1$ and $d_2$ at other positions can be calculated by designing a small number of initial values of $d_1$ and $d_2$ without designing each value of $d_1$ and $d_2$, to simplify the design of the light-transmissive regions.

In another embodiment, the variation rule of $d_1$ or $d_2$ may not be limited to one rule, for example, at least two sub-rules may be alternated. In an embodiment, in at least one of the first direction and the second direction, $d_1$ in sub-regions varies according to a third rule, and/or $d_2$ in sub-regions varies according to a fourth rule. The third rule includes a first sub-rule and a second sub-rule, the first sub-rule includes $m_1$ different values of $d_1$, the second sub-rule includes $m_2$ different values of $d_1$, and a sub-region including the first sub-rule and a sub-region including the second sub-rule are alternately disposed; the fourth rule includes a third sub-rule and a fourth sub-rule, the third sub-rule includes $n_1$ different values of $d_2$, the fourth sub-rule includes $n_2$ different values of $d_2$, and a sub-region including the third sub-rule and a sub-region including the fourth sub-rule are alternately disposed, where $m_1 \geq 2$, $m_2 \geq 2$, $n_1 \geq 2$, $n_2 \geq 2$, and each of $m_1$, $m_2$, $n_1$ and $n_2$ is an integer.

In a specific implementation, $d_1$ may be designed to vary in the first direction according to the third rule, vary in the second direction according to the third rule, or vary in both the first direction and the second direction according to the third rule (which may be different specific rules in the first direction and the second direction); $d_2$ may be designed to vary in the first direction according to the fourth rule, vary in the second direction according to the fourth rule, or vary in both the first direction and the second direction according to the fourth rule (which may be different specific rules in the first direction and the second direction); $d_1$ may be designed to vary in the first direction according to the third rule, and at the same time, $d_2$ may be designed to vary in the first direction or the second direction according to the fourth rule or vary in both the first direction and the second direction according to the fourth rule; or $d_1$ may be designed to vary in the second direction according to the third rule, and at the same time, $d_2$ may be designed to vary in the first direction or the second direction according to the fourth rule or vary in both the first direction and the second direction according to the fourth rule. The third rule and the fourth rule may be designed according to an actual situation and are not limited in the embodiments of the present disclosure. In an embodiment, in the first sub-rule, the $m_1$ different values of $d_1$ are in an arithmetic progression, and in the second sub-rule, the $m_2$ different values of $d_1$ are in an arithmetic progression; and/or in the third sub-rule, the $n_1$ different values of $d_2$ are in an arithmetic progression, and in the fourth sub-rule, the $n_2$ different values of $d_2$ are in an arithmetic progression. That is, only the first sub-rule and the second sub-rule may be set, only the third sub-rule and the fourth sub-rule may be set, or all of the first sub-rule, the second sub-rule, the third sub-rule and the fourth sub-rule may be set. The sub-rules are alternated, which can improve the randomness of the light-transmissive regions and the effect of preventing the diffraction without increasing a design difficulty too much.

Figure 10:
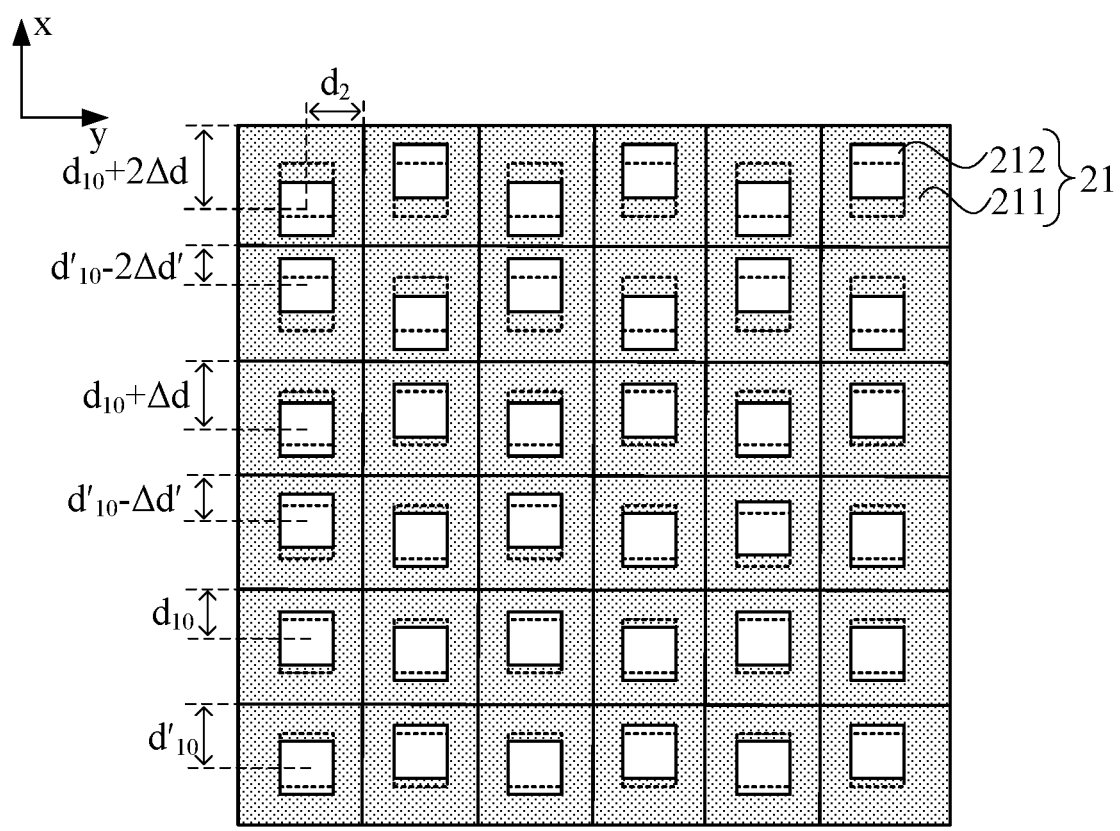
FIG. 10 is a structure diagram of another transparent display region according to an embodiment of the present disclosure.
Figure 11:
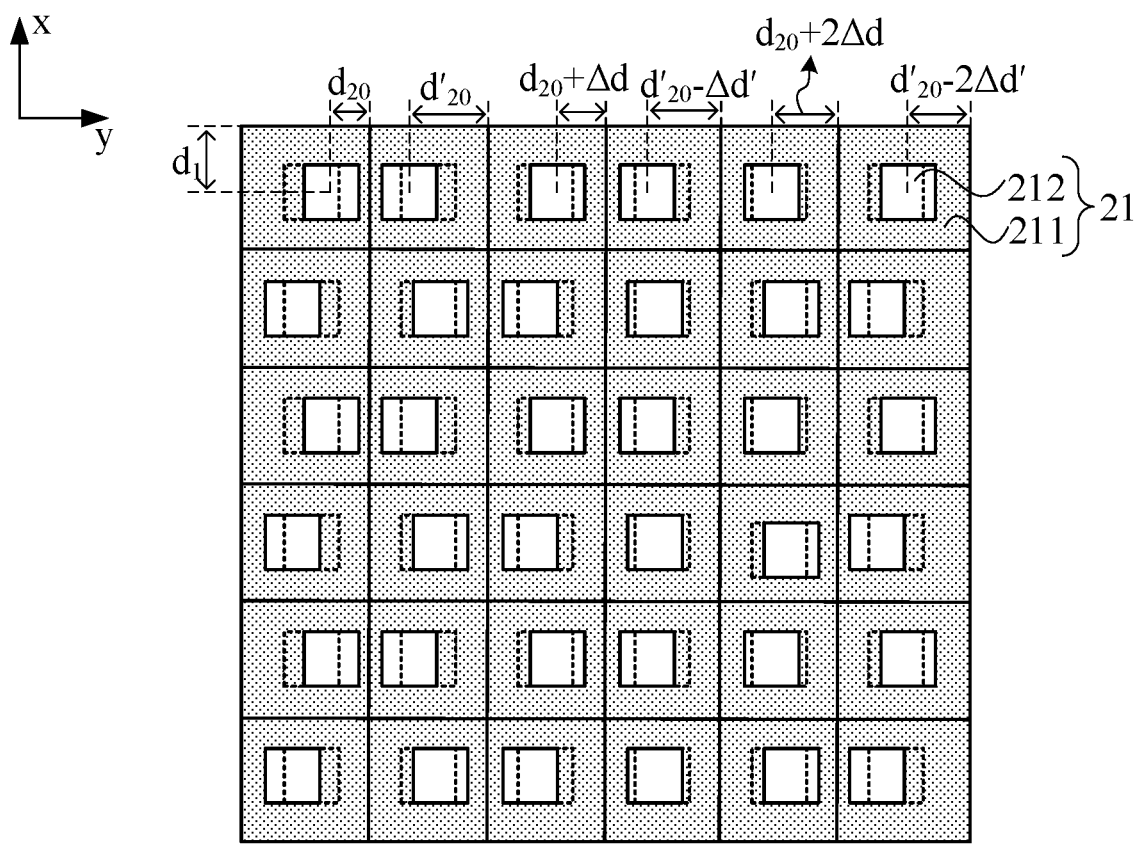
FIG. 11 is a structure diagram of another transparent display region according to an embodiment of the present disclosure.

In an embodiment, $m_1=m_2=n_1=n_2=3$. FIG. 10 is a structure diagram of another transparent display region according to an embodiment of the present disclosure. Referring to FIG. 10, in the first direction x (the column direction), $d_1$ in the sub-regions alternately varies according to two rules of arithmetic progressions. In an embodiment, in the first direction x, $d_1$ in the first, third and fifth sub-regions among the sub-regions in the first column progressively increases in an arithmetic progression, $d_1$ in the first, third and fifth sub-regions among the sub-regions in the third column progressively increases in the arithmetic progression, and $d_1$ in the first, third and fifth sub-regions among the sub-regions in the fifth column progressively increases in the arithmetic progression, that is, $d_1$ in the first, third and fifth sub-regions among the sub-regions in the first, third and fifth columns increases in the arithmetic progression (FIG. 10 shows that $d_1$ in the first, third and fifth sub-regions in the first column are $d_{10}$, $d_{10}+\Delta d$ and $d_{10}+2\Delta d$, respectively); in the first direction x, $d_1$ in the second, fourth and sixth sub-regions among the sub-regions in the first column progressively decreases in an arithmetic progression, $d_1$ in the second, fourth and sixth sub-regions among the sub-regions in the third column progressively decreases in the arithmetic progression, and $d_1$ in the second, fourth and sixth sub-regions among the sub-regions in the fifth column progressively decreases in the arithmetic progression, that is, $d_1$ in the second, fourth and sixth sub-regions among the sub-regions in the first, third and fifth columns decreases in the arithmetic progression (FIG. 10 shows that $d_1$ in the second, fourth and sixth sub-regions in the first column are $d'_{10}$, $d'_{10}-\Delta d'$ and $d'_{10}-2\Delta d'$, respectively); and in the first direction x, $d_1$ in the first, third and fifth sub-regions among the sub-regions in the second, fourth and sixth columns progressively decreases in an arithmetic progression, and in the first direction x, $d_1$ in the second, fourth and sixth sub-regions among the sub-regions in the second, fourth and sixth columns progressively increases in an arithmetic progression, to reduce the diffraction in the light-transmissive regions. Similarly, FIG. 11 is a structure diagram of another transparent display region according to an embodiment of the present disclosure. Referring to FIG. 11, in the second direction y (the row direction), $d_2$ in the sub-regions alternately varies according to two rules of arithmetic progressions. In an embodiment, in the second direction y, $d_2$ in the first, third and fifth sub-regions among the sub-regions in the first row progressively increases in an arithmetic progression, $d_2$ in the first, third and fifth sub-regions among the sub-regions in the third row progressively increases in the arithmetic progression, and $d_2$ in the first, third and fifth sub-regions among the sub-regions in the fifth row progressively increases in the arithmetic progression, that is, $d_2$ in the first, third and fifth sub-regions among the sub-regions in the first, third and fifth rows increases in the arithmetic progression (FIG. 11 shows that $d_2$ in the first, third and fifth sub-regions in the first row are $d_{20}$, $d_{20}+\Delta d$ and $d_{20}+2\Delta d$, respectively); in the second direction y, $d_2$ in the second, fourth and sixth sub-regions among the sub-regions in the first row progressively decreases in an arithmetic progression, $d_2$ in the second, fourth and sixth sub-regions among the sub-regions in the third row progressively decreases in the arithmetic progression, and $d_2$ in the second, fourth and sixth sub-regions among the sub-regions in the fifth row progressively decreases in the arithmetic progression, that is, $d_2$ in the second, fourth and sixth sub-regions among the sub-regions in the first, third and fifth rows decreases in the arithmetic progression (FIG. 11 shows that $d_2$ in the second, fourth and sixth sub-regions in the first row are $d'_{20}$, $d'_{20}-\Delta d'$ and $d'_{20}-2\Delta d'$, respectively); and in the second direction y, $d_2$ in the first, third and fifth sub-regions among the sub-regions in the second, fourth and sixth rows progressively decreases in an arithmetic progression, and in the second direction y, $d_2$ in the second, fourth and sixth sub-regions among the sub-regions in the second, fourth and sixth rows progressively increases in an arithmetic progression, to reduce the diffraction in the light-transmissive regions. FIG.

Figure 12:
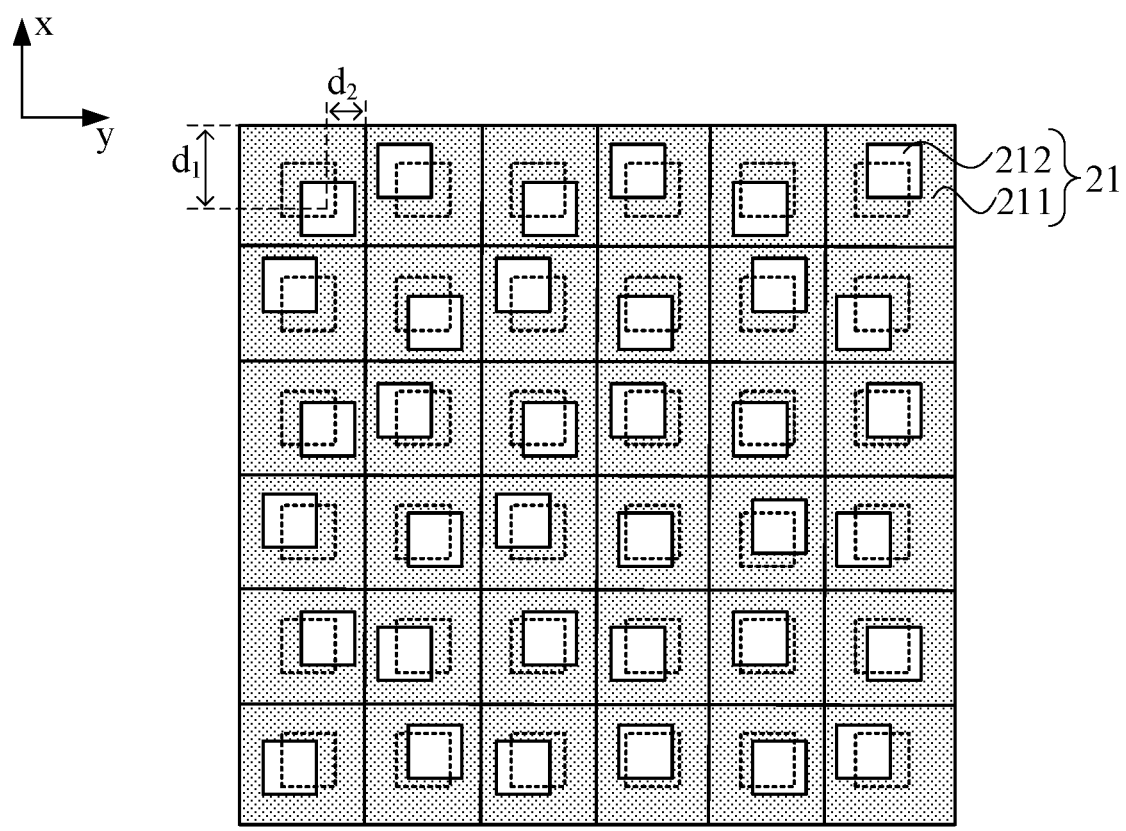
FIG. 12 is a structure diagram of another transparent display region according to an embodiment of the present disclosure.

12 is a structure diagram of another transparent display region according to an embodiment of the present disclosure. Referring to FIG. 12, in the first direction x, $d_1$ in the sub-regions alternately varies according to the two rules of arithmetic progressions, and in the second direction y, $d_2$ in the sub-regions also alternately varies according to the two rules of arithmetic progressions, that is, the light-transmissive regions in FIG. 12 vary according to a rule of superimposing the rules of the light-transmissive regions in FIGS. 10 and 11. In other embodiments, $d_1$ may vary in the second direction y, $d_2$ may vary in the first direction x, or both $d_1$ and $d_2$ may vary in the first direction x or the second direction y, which may be flexibly selected according to an actual situation in a specific implementation.

In other embodiments, the values of $d_1$ and $d_2$ may vary according to other rules, or may vary randomly within specified ranges according to no particular rules, which is not limited in the embodiments of the present disclosure.

In the embodiments of the present disclosure, the light-transmissive regions have the same area. The light-transmissive regions have the same area, which can ensure that the light-transmissive regions have substantially the same transmittance, ensure that the light-transmissive regions are distributed according to the maximum area, and improve the light transmission uniformity of the transparent display region.

In some embodiments, the transparent display region may occupy a relatively large area (for example, the entire display region is the transparent display region). In this case, the number of sub-regions is relatively large. However, limited by the conditions of the non-light-transmissive regions that light-emitting elements and pixel circuits need to be disposed, the values of $d_1$ and $d_2$ are limited and the completely random distribution of the light-transmissive regions cannot be achieved. At this time, the transparent display region may be divided into a plurality of blocks, and the light-transmissive regions in each block are arranged in the same manner, or only some light-transmissive regions in each block are arranged in a different manner. In an embodiment, the transparent display region includes at least two blocks, and each of the at least two blocks includes (x×y) sub-regions arranged in an array; and in the same block, at least two sub-regions have at least one of different $d_1$ or different $d_2$, where x≥2, y≥2, and each of x and y is an integer.

Figure 13:
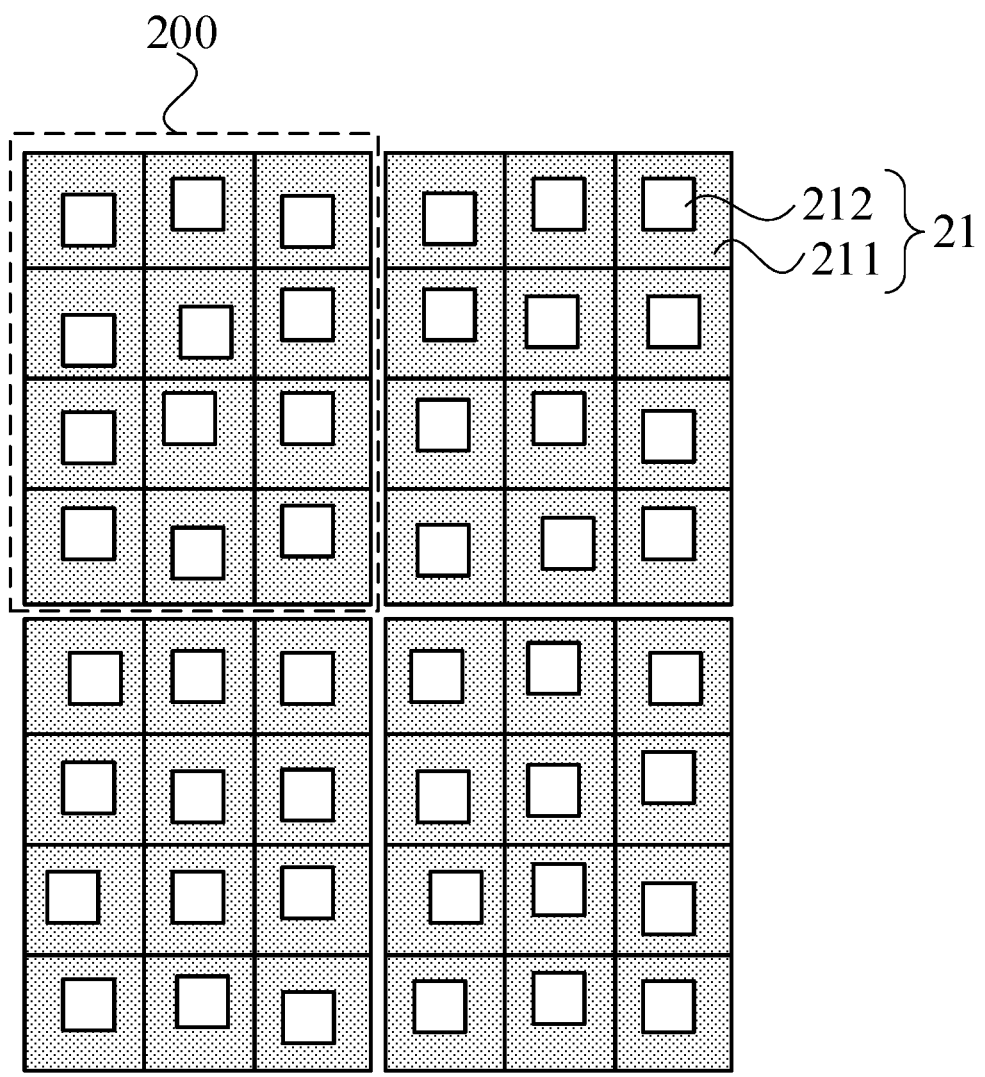
FIG. 13 is a structure diagram of another transparent display region according to an embodiment of the present disclosure.

At least one of $d_1$ and $d_2$ is different for at least two sub-regions, which is designed in the same manner as that in the preceding embodiments and is not described in detail here. In an embodiment, FIG. 13 is a structure diagram of another transparent display region according to an embodiment of the present disclosure. Referring to FIG. 13, the transparent display region includes a plurality of blocks 200 (four blocks 200 are illustratively shown in FIG. 13, which are not to limit the embodiments of the present disclosure; to distinguish different blocks 200, gaps are shown between the blocks 200). Each block 200 includes (x×y) (in the present embodiment, x=3 and y=4 as an example) sub-regions 21. In the same block 200, at least one of $d_1$ and $d_2$ is different ($d_1$ and $d_2$ are not shown in FIG. 13), that is, the light-transmissive regions 212 in the same block 200 are randomly distributed. Specific manners in which the light-transmissive regions 212 are designed are similar to those in the preceding embodiments, for example, at least one of $d_1$ or $d_2$ may vary according to a rule of an arithmetic progression.

In an embodiment, the transparent display region includes one type of block, where $d_1$ in a sub-region in a j-th column of an i-th row is the same for all the at least two blocks, and $d_2$ in the sub-region in the j-th column of the i-th row is the same for all the at least two blocks, where i≤x, j≤y, and each of i and j is an integer.

Figure 14:
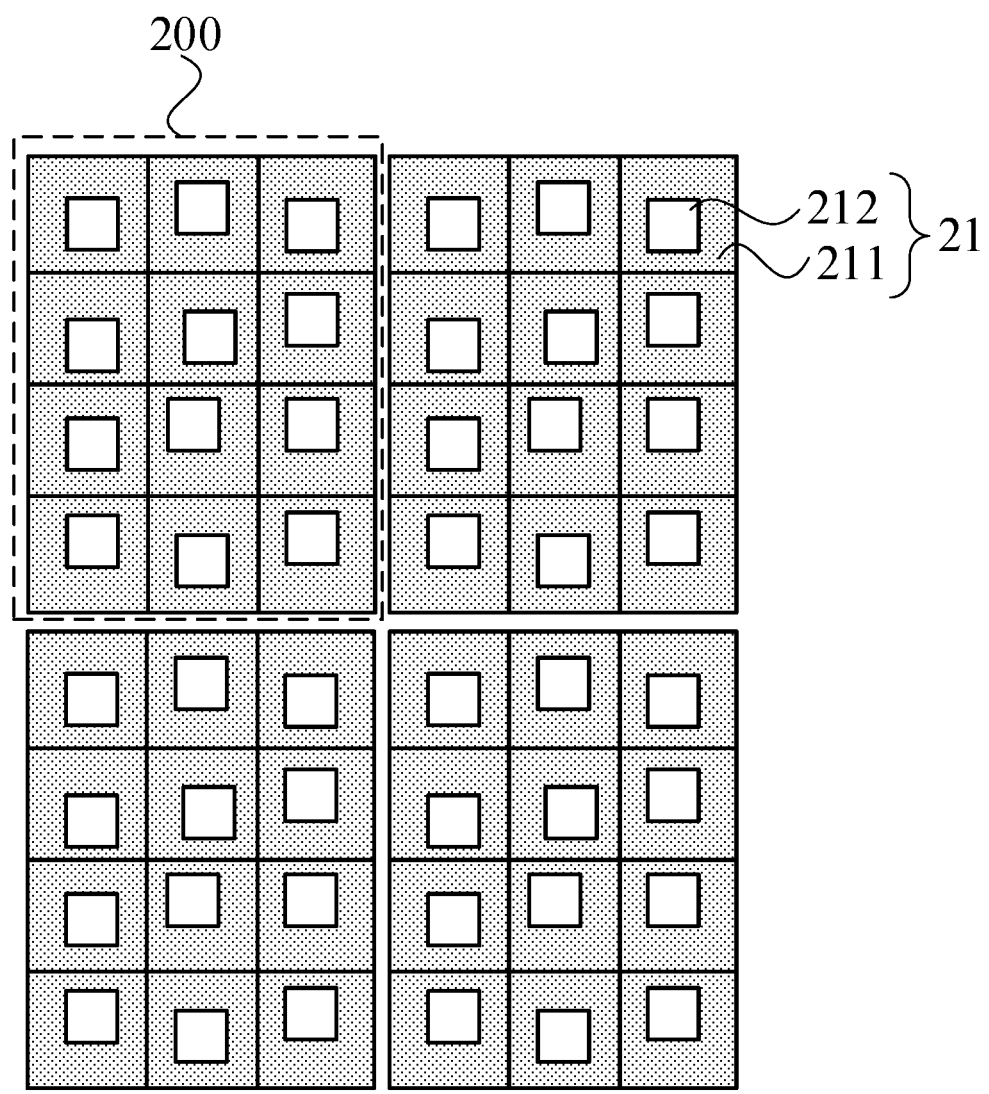
FIG. 14 is a structure diagram of another transparent display region according to an embodiment of the present disclosure.

Exemplarily, FIG. 14 is a structure diagram of another transparent display region according to an embodiment of the present disclosure. Four blocks 200 are illustratively shown in FIG. 14, and each block 200 includes 3×4 sub-regions 21. The sub-region 21 in the same position (the j-th column of the i-th row) of each block 200 has the same $d_1$ and $d_2$ ($d_1$ and $d_2$ are not shown in FIG. 14). When the transparent display region includes one type of block, one block forms one minimum repeating unit, the light-transmissive regions in the block are randomly arranged, and the plurality of blocks are repeatedly arranged to form a quasi-periodic arrangement of the light-transmissive regions. This arrangement can reduce the design difficulty of the transparent display region on the basis of reducing the diffraction.

In an embodiment, the transparent display region includes at least two types of block, and each of the two types of block includes at least one sub-region in which at least one of $d_1$ and $d_2$ is different.

Figure 15:
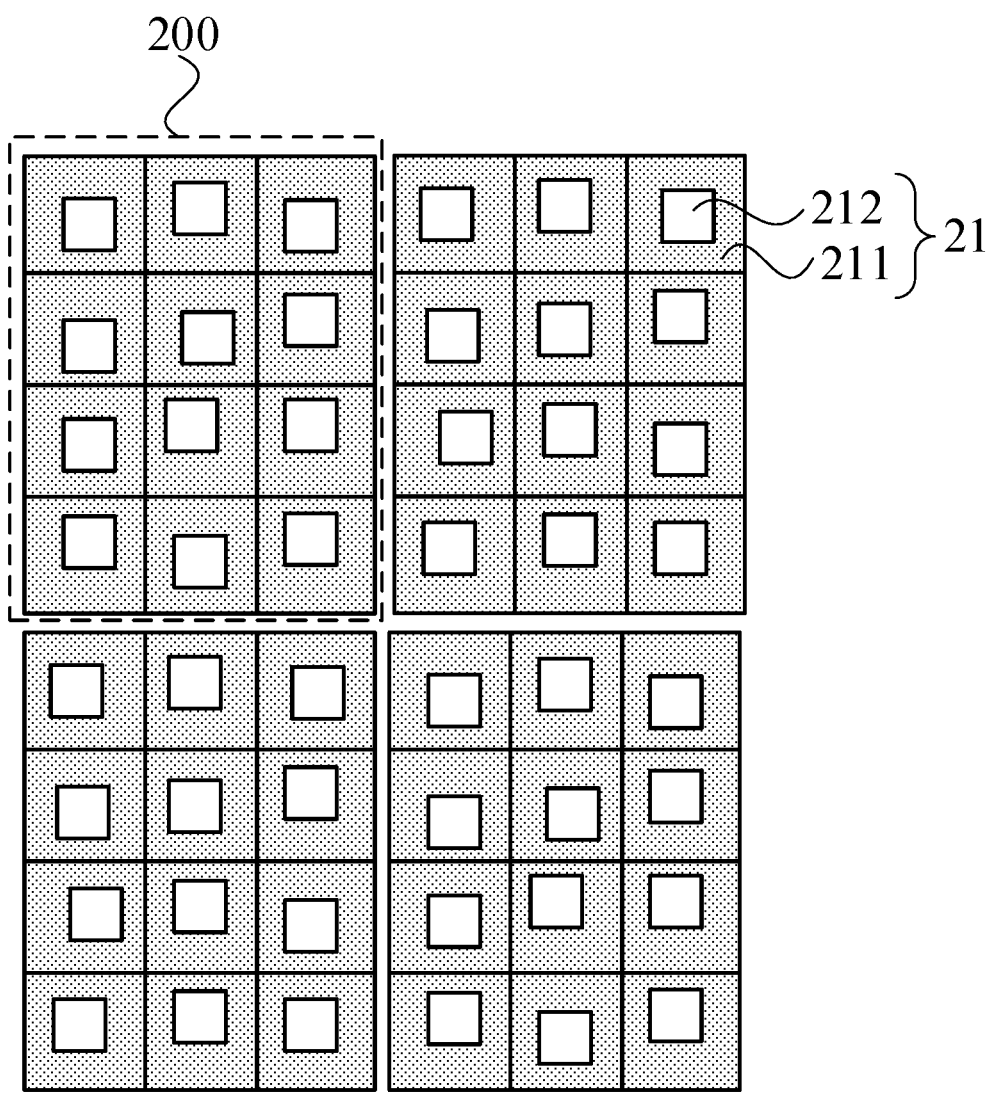
FIG. 15 is a structure diagram of another transparent display region according to an embodiment of the present disclosure.

FIG. 15 is a structure diagram of another transparent display region according to an embodiment of the present disclosure. Illustratively, FIG. 15 shows that the block in the first column of the first row and the block in the second column of the second row are of the same type, and the block in the second column of the first row and the block in the first column of the second row are of the same type. In other embodiments, more types of block may also be disposed. For example, the light-transmissive regions in each block are arranged differently and the completely random distribution of the light-transmissive regions is approximately achieved. When more than one type of block are disposed, the arrangement of the light-transmissive regions is more random, which is more conducive to reducing the light diffraction.

In an embodiment, x=y; in the same block, $d_1$ and $d_2$ in the same sub-region have a combination which form x types of different sub-regions; sub-regions in the same row include the x types of different sub-regions, and two adjacent sub-regions are of different types; and sub-regions in the same column include the x types of different sub-regions, and two adjacent sub-regions are of different types.

Figure 16:
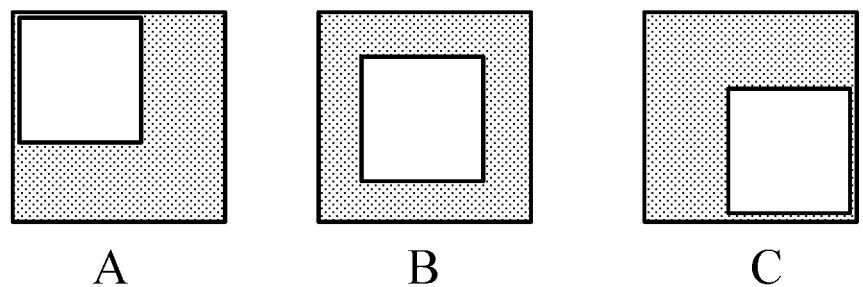
FIG. 16 is a structure diagram of three types of sub-region according to an embodiment of the present disclosure.
Figure 17:
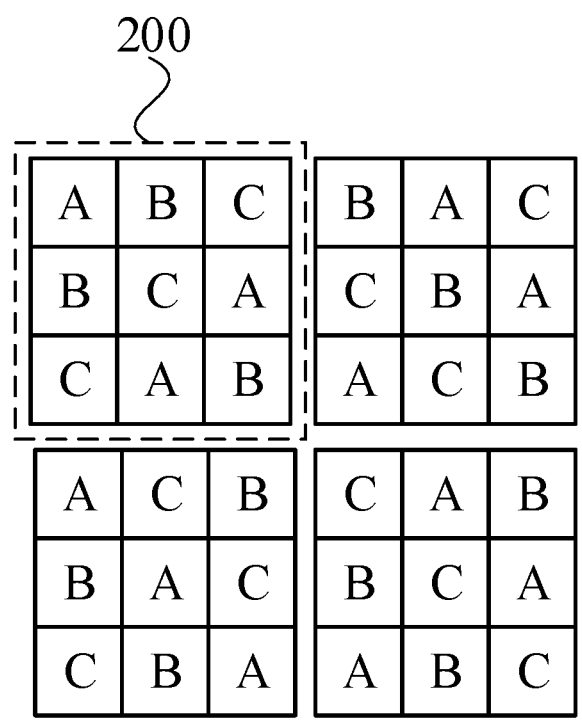
FIG. 17 is a structure diagram of another transparent display region according to an embodiment of the present disclosure.

It is to be understood that one combination of $d_1$ and $d_2$ corresponds to one manner of disposing the light-transmissive region, that is, one type of sub-region. In the present embodiment, since the sub-regions have the same shape, when at least one of $d_1$ and $d_2$ is different, the relative position of the light-transmissive region in the sub-region is different. When the transparent display region is designed, the positions of the light-transmissive regions in the sub-regions need to be distributed relatively uniformly to improve the light transmission uniformity of the light-transmissive regions. In an embodiment, x=y=3. FIG. 16 is a structure diagram of three types of sub-region according to an embodiment of the present disclosure. The three types of sub-region are denoted by A, B and C, respectively, and the three types of sub-region A, B and C may form a plurality of types of block with different arrangements. Exemplarily, FIG. 17 is a structure diagram of another transparent display region according to an embodiment of the present disclosure. Four different types of block 200 are shown in FIG. 17.

In an embodiment, the transparent display region includes at least (x!×(x−1)!) types of block, where x! denotes a factorial of x, and (x−1)! denotes a factorial of (x−1).

For a block including (xxx) sub-regions, when $d_1$ and $d_2$ have a combination, for example, when x=2, two types of light-transmissive region may be disposed in the sub-region in the first column of the first row. Since two adjacent sub-regions in the same row or the same column are of different types, when the sub-region in the first column of the first row is determined, the block has a determined arrangement, that is, when x=2, the transparent display region includes two types of block. When x=3, three types of light-transmissive region may be disposed in the first column of the first row. Since the sub-region in the second column of the first row cannot be the same as the sub-region in the first column of the first row, two types of light-transmissive region may be disposed in the second column of the first row, one type of light-transmissive region may be disposed in the third column of the first row, two types of light-transmissive region may be disposed in the first column of the second row, and one type of light-transmissive region may be disposed in the first column of the third row. According to the manner in which the light-transmissive region in the first row and the first column is disposed, there are 3×2×1×2×1=12 types of block. When x>3, x, x−1, x−2, . . . and 1 type of light-transmissive region may be disposed in the first column of the first row to the x-th column of the first row, respectively, and x−1, x−2, . . . and 1 type of light-transmissive region may be disposed in the first column of the second row to the first column of the x-th row, respectively. A plurality of types of light-transmissive region may also be disposed in the second column of the second row, and so on. It can be seen that at least (x!×(x−1)!) types of block are included.

Figure 18:
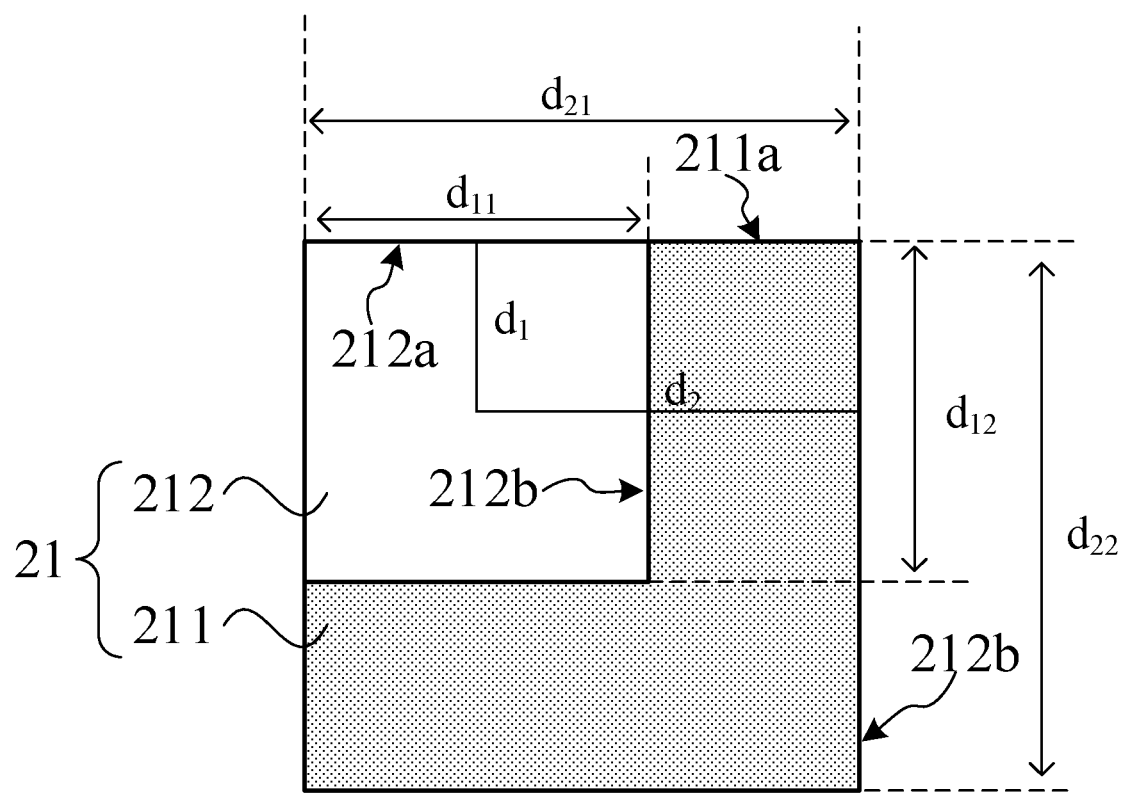
FIG. 18 is a structure diagram of another sub-region according to an embodiment of the present disclosure.
Figure 19:
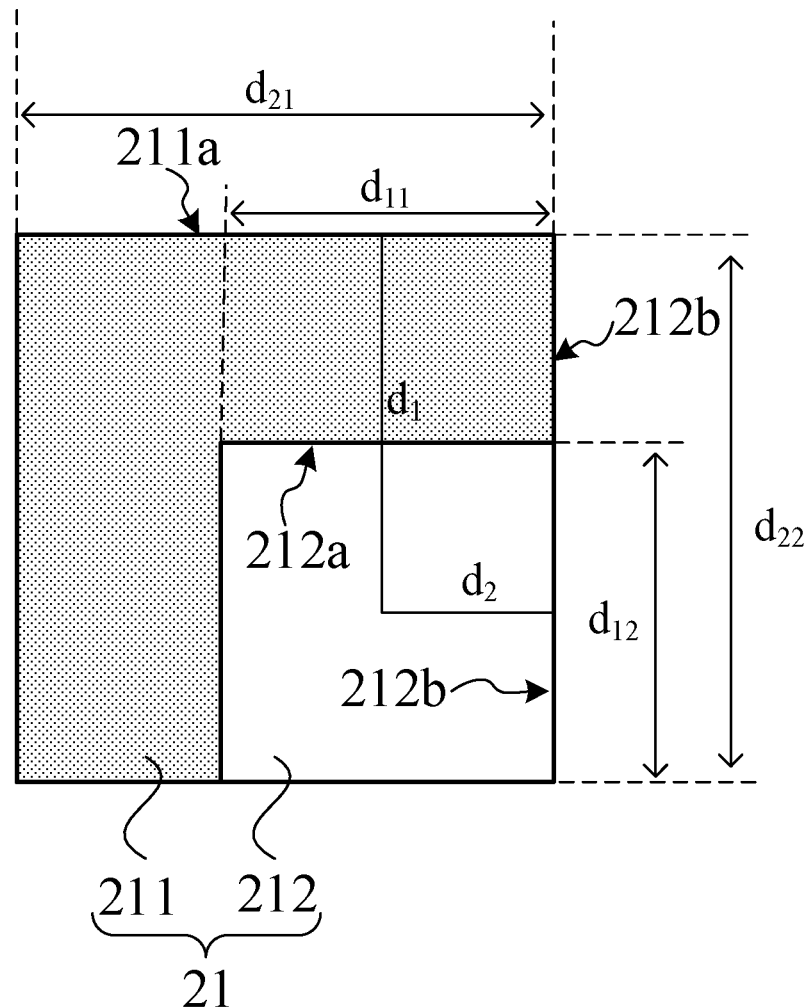
FIG. 19 is a structure diagram of another sub-region according to an embodiment of the present disclosure.

FIG. 18 is a structure diagram of another sub-region according to an embodiment of the present disclosure. FIG. 19 is a structure diagram of another sub-region according to an embodiment of the present disclosure. Referring to FIGS. 18 and 19, in an embodiment, the sub-region 21 and the light-transmissive region 212 are rectangular in shape, and at least two adjacent bezel regions of the sub-region 21 include the non-light-transmissive region 211; a first side 212*a* of the light-transmissive region 212 is adjacent to and parallel to the first side 21*a* of the sub-region and has a length of $d_{11}$, and the first side 21*a* of the sub-region 21 has a length of $d_{21}$; a second side 212*b* of the light-transmissive region 212 is adjacent to and parallel to the second side 21*b* of the sub-region 21 and has a length of $d_{12}$, and the second side 21*b* of the sub-region 21 has a length of $d_{22}$, where $d_{11} < d_{21}$, $d_{12} < d_{22}$, $d_{12}/2 \leq d_1 \leq d_{22}-d_{12}/2$, and $d_{11}/2 \leq d_2 \leq d_{21}-d_{11}/2$.

In a specific implementation, the shape of the sub-region and the shape of the light-transmissive region may also be a rounded rectangle or the like, and the first side of the light-transmissive region is approximately parallel to the first side of the sub-region. Since the light-transmissive region 212 is disposed inside the sub-region 21 and the non-light-transmissive region 211 needs to be reserved in the sub-region 21 to dispose the light-emitting element, a driver circuit, various wires and the like, the light-transmissive region 212 is smaller than the sub-region 21, that is, $d_{11} < d_{21}$, and $d_{12} < d_{22}$. Referring to FIG. 18, when the relative position of the light-transmissive region 212 in the sub-region 21 is that the light-transmissive region 212 is disposed in an upper left corner of the sub-region 21, $d_1$ is a minimum value $d_{12}/2$, and $d_2$ is a maximum value $d_{21}-d_{11}/2$. Referring to FIG. 19, when the relative position of the light-transmissive region 212 in the sub-region 21 is that the light-transmissive region 212 is disposed in a lower right corner of the sub-region 21, $d_1$ is a maximum value $d_{22}-d_{12}/2$, and $d_2$ is a minimum value $d_{11}/2$. Therefore, the value of $d_1$ satisfies that $d_{12}/2 \leq d_1 \leq d_{22}-d_{12}/2$, and the value of $d_2$ satisfies that $d_{11}/2 \leq d_2 \leq d_{21}-d_{11}/2$.

In the present embodiment, the light-transmissive region is disposed in the sub-region and each sub-region has certain transparency. In the case where the sub-region has a determined area, the larger the area of the light-transmissive region, the higher the transmittance of the sub-region, and the smaller the area of the light-transmissive region, the lower the transmittance of the sub-region. The light-transmissive regions need to be arranged randomly to a certain extent, that is, $d_1$ and $d_2$ need to have preset variation ranges. For this purpose, an actual light-transmissive region needs to have a smaller area than a largest light-transmissive region that can be theoretically designed. As can be seen from FIGS. 18 and 19, theoretically, the maximum value of the variation of $d_1$ is $d_{22}-d_{12}$, and the maximum value of the variation of $d_2$ is $d_{21}-d_{11}$. In the present embodiment, $d_{21}-d_{11} \leq 0.1 \times d_{21}$ and $d_{22}-d_{12} \leq 0.1 \times d_{22}$ to balance the randomness and the transmittance of the light-transmissive regions and a loss of the transmittance can be reduced as much as possible while the area of the light-transmissive region is reduced for random distribution.

In an embodiment, a maximum difference value between $d_1$ in two sub-regions is $d_{1max}$, a maximum difference value between $d_2$ in two sub-regions is $d_{2max}$, and the light-transmissive region in the sub-region has a maximum size of $D_1$ in the first direction and a maximum size of $D_2$ in the second direction, where $d_{1max} \leq 0.1 \times D_2$, and $d_{2max} \leq 0.1 \times D_1$.

It is to be understood that since the transparent display region is also used for display, that is, the light-emitting element, the related driver circuit, circuit wires and the like need to be provided in the non-light-transmissive region in the sub-region, in an actual design, the maximum difference $d_{1max}$ (the maximum difference value between $d_1$ in two sub-regions) of the variation of $d_1$ needs to be less than $d_{22}-d_{12}$, the maximum size $D_2$ of the light-transmissive region in the second direction needs to be less than $d_{22}$, the maximum difference $d_{2max}$ (the maximum difference value between $d_2$ in two sub-regions) of the variation of $d_2$ needs to be less than $d_{21}-d_{11}$, the maximum size $D_1$ of the light-transmissive region in the first direction needs to be less than $d_{21}$, and $d_{1max} \leq 0.1 \times D_2$, and $d_{2max} \leq 0.1 \times D_1$, that is $$\frac{(D_2 - d_{1max})(D_1 - d_{2max})}{D_2 \times D_1} > \frac{0.9D_2 \times 0.9D_1}{D_2 \times D_1} = 0.81,$$

which can ensure that the transmittance after the light-transmissive regions are randomly distributed is greater than 81% of the transmittance before the light-transmissive regions are randomly distributed.

In an embodiment, an absolute value of a minimum non-zero difference value between $d_1$ in two different sub-regions is $d_{1min}$, and an absolute value of a minimum non-zero difference value between $d_2$ in two different sub-regions is $d_{2min}$, where $d_{1min}/d_{22} > 1\%$, and $d_{2min}/d_{21} > 1\%$.

That $d_{1min}/d_{22} > 1\%$ and $d_{2min}/d_{21} > 1\%$ can ensure the variations of $d_1$ and $d_2$, the randomness of the design of the light-transmissive regions and the good effect of reducing the diffraction.

In an embodiment, the light-transmissive regions have the same area. The transparent display region includes at least two blocks, and each of the at least two blocks includes 4×4 sub-regions, and each of the at least two blocks includes a first type of sub-region, a second type of sub-region, a third type of sub-region and a fourth type of sub-region, where $d_1=d_{12}/2$ and $d_2=d_{21}-d_{11}/2$ in the first type of sub-region, $d_1=d_{12}/2$ and $d_2=d_{11}/2$ in the second type of sub-region, $d_1=d_{22}-d_{12}/2$ and $d_2=d_{21}-d_{11}/2$ in the third type of sub-region, and $d_1=d_{22}-d_{12}/2$ and $d_2=d_{11}/2$ in the fourth type of sub-region. Any two adjacent sub-regions in the same row are of different types, and any two adjacent sub-regions in the same column are of different types.

Figure 20:
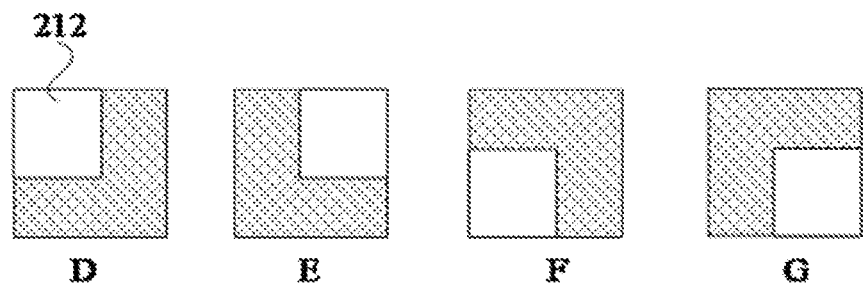
FIG. 20 is a structure diagram of four types of sub-region according to an embodiment of the present disclosure.
Figure 21:
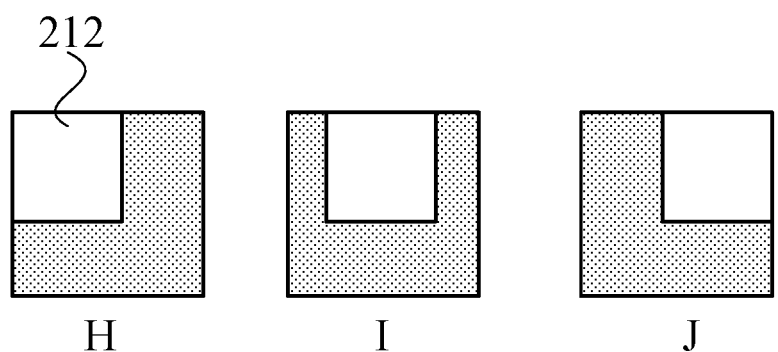
FIG. 21 is a structure diagram of another transparent display region according to an embodiment of the present disclosure.

In an embodiment, FIG. 20 is a structure diagram of four types of sub-region according to an embodiment of the present disclosure. Referring FIG. 20, the four types of sub-region are denoted by D, E, F and G, respectively; in the first type of sub-region D, the light-transmissive region 212 is located in an upper left corner of the sub-region, that is, $d_1=d_{12}/2$, and $d_2=d_{21}-d_{11}/2$; in the second type of sub-region E, the light-transmissive region 212 is located in an upper right corner of the sub-region, that is, $d_1=d_{12}/2$, and $d_2=d_{11}/2$; in the third type of sub-region F, the light-transmissive region 212 is located in a lower left corner of the sub-region, that is, $d_1=d_{22}-d_{12}/2$, and $d_2=d_{21}-d_{11}/2$; in the fourth type of sub-region G, the light-transmissive region 212 is located in a lower right corner of the sub-region, that is, $d_1=d_{22}-d_{12}/2$, and $d_2=d_{11}/2$. FIG. 21 is a structure diagram of another transparent display region according to an embodiment of the present disclosure. In an embodiment, four blocks 200 are shown in FIG. 21, and each block 200 has a different arrangement. Therefore, the positions of the light-transmissive regions in the sub-regions can be distributed relatively uniformly, and the overall transmittance is uniform, avoiding the case where some regions are too bright or too dark. The four types of block shown in FIG. 21 are only illustrative. It can be seen from the preceding embodiments that there are at least 4×3×2×1×3×2×1=144 types of block.

Similarly, six types of sub-region may also be included. In an embodiment, the light-transmissive regions have the same area. The transparent display region includes at least two blocks, each of the at least two blocks includes 6×6 sub-regions, and each of the at least two blocks includes a fifth type of sub-region, a sixth type of sub-region, a seventh type of sub-region, an eighth type of sub-region, a ninth type of sub-region and a tenth type of sub-region, where $d_1=d_{12}/2$ and $d_2=d_{21}-d_{11}/2$ in the fifth type of sub-region, $d_1=d_{12}/2$ and $d_2=d_{21}/2$ in the sixth type of sub-region, $d_1=d_{12}/2$ and $d_2=d_{11}/2$ in the seventh type of sub-region, $d_1=d_{22}-d_{12}/2$ and $d_2=d_{21}-d_{11}/2$ in the eighth type of sub-region, $d_1=d_{22}-d_{12}/2$ and $d_2=d_{21}/2$ in the ninth type of sub-region, and $d_1=d_{22}-d_{12}/2$ and $d_2=d_{11}/2$ in the tenth type of sub-region. Any two adjacent sub-regions in the same row are of different types, and any two adjacent sub-regions in the same column are of different types.

Figure 22:
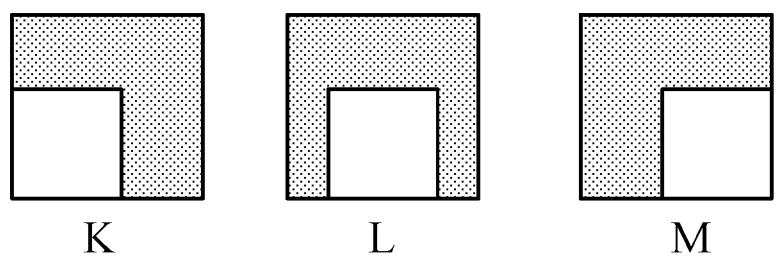
FIG. 22 is a structure diagram of six types of sub-region according to an embodiment of the present disclosure.
Figure 23:
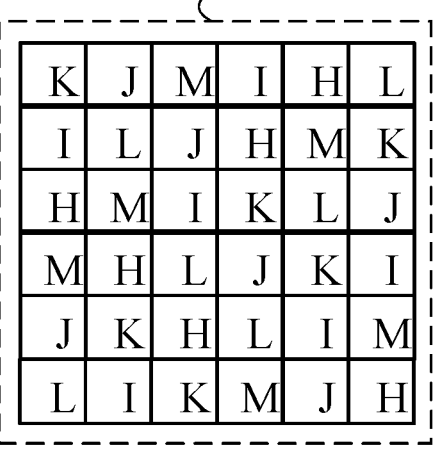
FIG. 23 is a structure diagram of another transparent display region according to an embodiment of the present disclosure.

In an embodiment, FIG. 22 is a structure diagram of six types of sub-region according to an embodiment of the present disclosure. Referring to FIG. 22, the six types of sub-region are denoted by H, I, J, K, L, and M, respectively; in the fifth type of sub-region H, the light-transmissive region 212 is located in an upper left corner of the sub-region, that is, $d_1=d_{12}/2$, and $d_2=d_{21}-d_{11}/2$; in the sixth type of sub-region I, the light-transmissive region 212 is located in an upper middle position of the sub-region, that is, $d_1=d_{12}/2$, and $d_2=d_{21}/2$; in the seventh type of sub-region J, the light-transmissive region 212 is located in an upper right corner of the sub-region, that is, $d_1=d_{12}/2$, and $d_2=d_{11}/2$; in the eighth type of sub-region K, the light-transmissive region 212 is located in a lower left corner of the sub-region, that is, $d_1=d_{22}-d_{12}/2$, and $d_2=d_{21}-d_{11}/2$; in the ninth type of sub-region L, the light-transmissive region 212 is located in a lower middle position of the sub-region, that is, $d_1=d_{22}-d_{12}/2$, and $d_2=d_{21}/2$; in the tenth type of sub-region M, the light-transmissive region 212 is located in a lower right corner of the sub-region, that is, $d_1=d_{22}-d_{12}/2$, and $d_2=d_{11}/2$. FIG. 23 is a structure diagram of another transparent display region according to an embodiment of the present disclosure. In an embodiment, four blocks 200 are shown in FIG. 23, and each block 200 has a different arrangement. Therefore, the positions of the light-transmissive regions in the sub-regions can be distributed relatively uniformly, and the overall transmittance is uniform, avoiding the case where some regions are too bright or too dark. The four types of block shown in FIG. 23 are only illustrative. It can be seen from the preceding embodiments that there are at least 6×5×4×3×2×1×5×4×3×2×1=86400 types of block.

It is to be noted that the above types of sub-region are only exemplary examples. In other embodiments, one block may include another number of different types of sub-region. Different combinations of $d_1$ and $d_2$ may form more different types of sub-region, and which may be designed according to an actual situation in a specific implementation.

Figure 24:
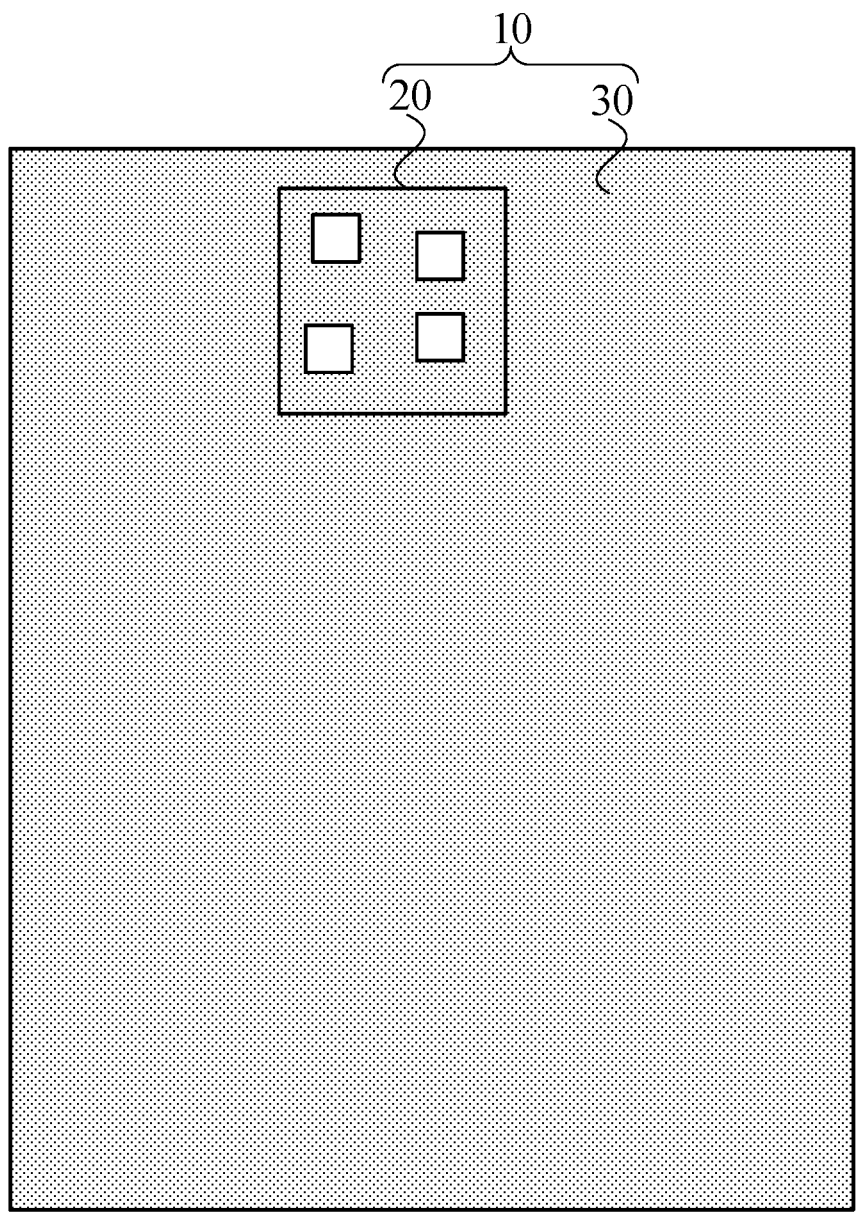
FIG. 24 is a structure diagram of another display panel according to an embodiment of the present disclosure.

FIG. 24 is a structure diagram of another display panel according to an embodiment of the present disclosure. Referring to FIG. 24, in an embodiment, the display region 10 further includes a conventional display region 30, and the transparent display region 20 also serves as a photosensor disposing region.

The photosensor may be a camera, and the display panel may achieve the full screen display of the under-screen camera. In a specific implementation, the display panel may include one type of light-emitting element, such as the OLED or the micro LED. Alternatively, two types of light-emitting element may be disposed, for example, the conventional display region 30 includes the OLED, and the transparent display region 20 includes the micro LED with a smaller volume, which are conducive to the design of the light-transmissive regions.

Figure 25:
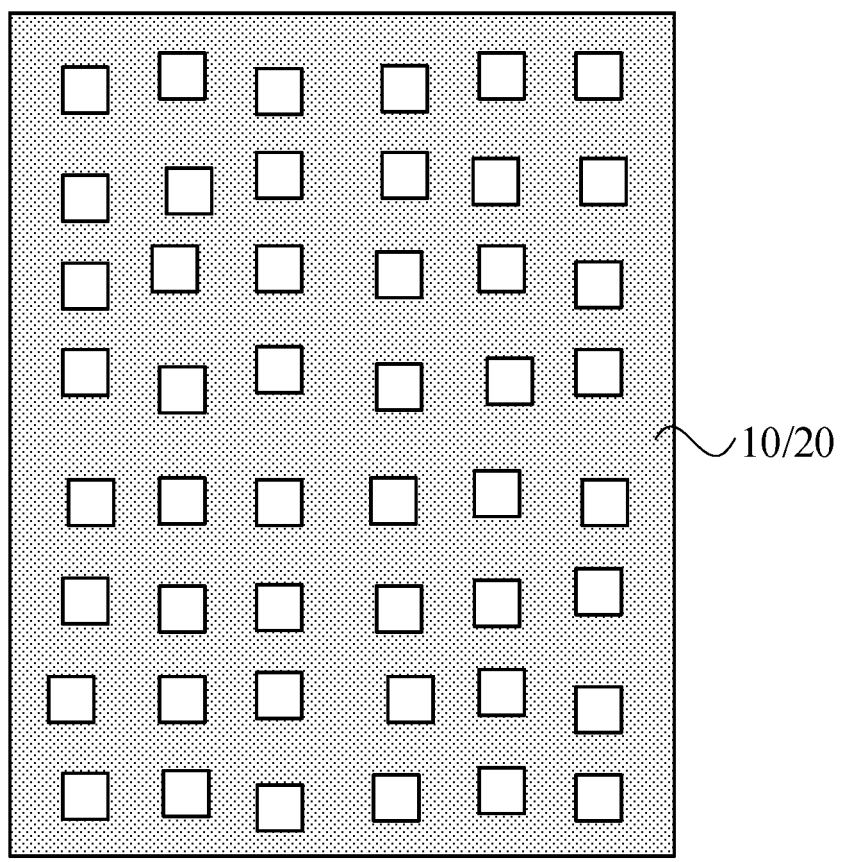
FIG. 25 is a structure diagram of another display panel according an embodiment of the present disclosure.

FIG. 25 is a structure diagram of another display panel according an embodiment of the present disclosure. Referring to FIG. 25, in an embodiment, all the display region 10 is the transparent display region 20 and transparent full screen display can be achieved. In an embodiment, the display panel may be used in applications such as a transparent television, a shop window and a display case.

In other embodiments, a first film may be disposed in the transparent display region. At least one of the following cases exists for different light-transmissive regions: (1) the first film has different thicknesses; (2) the first film is made of different materials; (3) the first film includes at least two sub-films which are stacked, and the thicknesses of the at least two sub-films are at different ratios and an optical path length or a phase difference of external light can be adjusted when the external light is transmitted through the light-transmissive regions, which further reduces the diffraction.

The first film has different thicknesses, which may include cases described below. In a first case, the first film is a single film, where the single film has different thicknesses in different light-transmissive regions, may be made through a halftone masking process for different thicknesses in different light-transmissive regions, and may be made of an organic material. In a second case, the first film includes a plurality of films which are stacked, where the first film includes different numbers of films in different light-transmissive regions and the first film has different thicknesses in different light-transmissive regions, and the plurality of films contained in the first film may be made of an inorganic material and an organic material. In a third case, the first film includes both a single film having different thicknesses in different light-transmissive regions and a plurality of films, where the first film includes different numbers of films in different light-transmissive regions.

The first film is made of different materials, which may include cases described below. In a first case, the first film is made of different inorganic materials in different light-transmissive regions, for example, the first film is made of silicon oxide and silicon nitride. In a second case, the first film is made of an organic material and an inorganic material in different light-transmissive regions.

The first film includes at least two sub-films which are stacked, and the thicknesses of the at least two sub-films are at different ratios. In an embodiment, the first film includes a first sub-film and a second sub-film which are stacked, and the light-transmissive region includes a first light-transmissive region and a second light-transmissive region, where a thickness of the first sub-film in the first light-transmissive region is greater than a thickness of the first sub-film in the second light-transmissive region, and a thickness of the second sub-film in the first light-transmissive region is less than a thickness of the second sub-film in the second light-transmissive region.

The embodiments of the present disclosure further provide a display device. The display device includes any one of the display panels provided in the preceding embodiments. In an embodiment, the display device may be a mobile phone, a tablet computer, a television, a display case including a transparent display panel or the like. The display device provided in the embodiments of the present disclosure includes any one of the display panels provided in the preceding embodiments and has the same or corresponding embodiments.

What is claimed is:

1. A display panel, comprising a display region, wherein at least a portion of the display region is a transparent display region;
    wherein the transparent display region comprises a plurality of sub-regions, the plurality of sub-regions are arranged in an array and have a same shape and a same area, and a sub-region of the plurality of sub-regions comprises a first side and a second side which are adjacent to each other, wherein a first side of a sub-region also serves as a side of an adjacent sub-region in a first direction, and a second side of the sub-region also serves as a side of an adjacent sub-region in a second direction, the first direction intersects with the second direction, and the first direction intersects with the first side; and
    wherein the sub-region comprises a non-light-transmissive region and a light-transmissive region, light-transmissive regions in the plurality of sub-regions have a same shape, a distance between a center of the light-transmissive region and a first side of a sub-region where the light-transmissive region is located is $d_1$, a distance between the center of the light-transmissive region and a second side of the sub-region where the light-transmissive region is located is $d_2$, and at least two of the plurality of sub-regions have at least one of different di or different $d_2$;
    wherein light-transmissive regions of the plurality of sub-regions have a same area;
    wherein each of the plurality of sub-regions and each of the light-transmissive regions are rectangular in shape, and at least two adjacent bezel regions of the sub-region comprise the non-light-transmissive region;
    wherein a first side of the light-transmissive region is adjacent to and parallel to the first side of the sub-region, the first side of the light-transmissive region has a length of $d_{11}$, the first side of the sub-region has a length of $d_{21}$, a second side of the light-transmissive region is adjacent to and parallel to the second side of the sub-region and has a length of $d_{12}$, and the second side of the sub-region has a length of $d_{22}$;
    wherein $d_{11} < d_{21}$, $d_{12} < d_{22}$, $d_{12}/2 \le d_1 \le d_{22} - d_{12}/2$, and $d_{11}/2 \le d_2 \le d_{21} - d_{11}/2$; and
    wherein $d_{21} - d_{11} < 0.1 \times d_{21}$, and $d_{22} - d_{12} < 0.1 \times d_{22}$;
    wherein a maximum difference value between $d_1$ in two sub-regions is $d_{1max}$, a maximum difference value between $d_2$ in two sub-regions is $d_{2max}$, the light-transmissive region in the sub-region has a maximum size of $D_1$ in the first direction, and the light-transmissive region in the sub-region has a maximum size of $D_2$ in the second direction; and
    wherein $d_{1max} < 0.1 \times D_2$, and $d_{2max} < 0.1 \times D_1$.

2. The display panel according to claim 1, wherein distances between centers of two adjacent light-transmissive regions have at least two different values.

3. The display panel according to claim 1, wherein at least two adjacent sub-regions have at least one of different $d_1$ or different $d_2$.

4. The display panel according to claim 1, wherein in at least one of the first direction and the second direction, $d_1$ and $d_2$ in the plurality of sub-regions satisfy at least one of: $d_1$ in the plurality of sub-regions varies according to a first rule, or $d_2$ in the plurality of sub-regions varies according to a second rule,
    wherein the first rule comprises m different values of $d_1$, the second rule comprises n different values of $d_2$, wherein m≥2, n≥2, and each of m and n is an integer.

5. The display panel according to claim 4, wherein $d_1$ and $d_2$ in the plurality of sub-regions satisfy at least one of: in the first rule, the m different values of $d_1$ are in an arithmetic progression, or, in the second rule, the n different values of $d_2$ are in an arithmetic progression.

6. The display panel according to claim 1, wherein in at least one of the first direction and the second direction, $d_1$ and $d_2$ in the plurality of sub-regions satisfy at least one of: $d_1$ in the plurality of sub-regions varies according to a third rule, or $d_2$ in the plurality of sub-regions varies according to a fourth rule; and,
    wherein the third rule comprises a first sub-rule and a second sub-rule, the first sub-rule comprises $m_1$ different values of $d_1$, the second sub-rule comprises $m_2$ different values of $d_1$, and a sub-region complying with the first sub-rule and a sub-region complying with the second sub-rule are alternately disposed; and the fourth rule comprises a third sub-rule and a fourth sub-rule, the third sub-rule comprises $n_1$ different values of $d_2$, the fourth sub-rule comprises $n_2$ different values of $d_2$, and a sub-region complying with the third sub-rule and a sub-region complying with the fourth sub-rule are alternately disposed, and wherein $m_1 \ge 2$, $m_2 \ge 2$, $n_1 \ge 2$, $n_2 \ge 2$, and each of $m_1$, $m_2$, $n_1$ and $n_2$ is an integer.

7. The display panel according to claim 6, wherein $d_1$ and $d_2$ in the plurality of sub-regions satisfy at least one of: in the first sub-rule, the $m_1$ different values of $d_1$ are in an arithmetic progression, and in the second sub-rule, the $m_2$ different values of $d_1$ are in an arithmetic progression; or
    in the third sub-rule, the $n_1$ different values of $d_2$ are in an arithmetic progression, and in the fourth sub-rule, the $n_2$ different values of $d_2$ are in an arithmetic progression.

8. The display panel according to claim 1, wherein the transparent display region comprises at least two blocks, and each of the at least two blocks comprises x×y sub-regions arranged in an array;
    wherein in a same block, at least two sub-regions have at least one of different $d_1$ or different $d_2$; and
    wherein x≥2, y≥2, and each of x and y is an integer.

9. The display panel according to claim 8, wherein the at least two blocks of the transparent display region are of a same type, wherein all sub-regions in a j-th column and an i-th row have a same $d_1$, and all sub-regions in the j-th column and the i-th row have a same $d_2$;
    wherein i≤x, j≤y, and each of i and j is an integer.

10. The display panel according to claim 8, wherein the at least two blocks comprised in the transparent display region are of at least two types, and blocks of the at least two types comprise at least one sub-region having at least one of different $d_1$ or different $d_2$.

11. The display panel according to claim 8, wherein x=y;
    wherein in a same block of the at least two blocks, x types of combinations of $d_1$ and $d_2$ exist in a same sub-region, and the x types of combinations of $d_1$ and $d_2$ form x types of different sub-regions; and
    wherein sub-regions in a same row comprise x types of different sub-regions, and two adjacent sub-regions in a same row are of different types; and wherein sub-regions in a same column comprise x types of different sub-regions, and two adjacent sub-regions in a same column are of different types,
    wherein the at least two blocks comprises at least (x!× (x−1)!) types of blocks, and wherein x! denotes a factorial of x, and (x−1)! denotes a factorial of (x−1).

12. The display panel according to claim 1, wherein an absolute value of a minimum non-zero difference value between $d_1$ in two different sub-regions is $d_{1min}$, and an absolute value of a minimum non-zero difference value between $d_2$ in two different sub-regions is $d_{2min}$, and wherein $d_{1min}/d_{22}>1\%$, and $d_{2min}/d_{21}>1\%$.

13. The display panel according to claim 12, wherein the light-transmissive regions of the plurality of sub-regions have a same area;
    wherein the transparent display region comprises at least two blocks, each of the at least two blocks comprises 4×4 sub-regions, and each of the at least two blocks comprises a first type of sub-region, a second type of sub-region, a third type of sub-region and a fourth type of sub-region, wherein $d_1=d_{12}/2$ and $d_2=d_{21}-d_{11}/2$ in the first type of sub-region, $d_1=d_{12}/2$ and $d_2=d_{11}/2$ in the second type of sub-region, $d_1=d_{22}-d_{12}/2$ and $d_2=d_{21}-d_{11}/2$ in the third type of sub-region, and $d_1=d_{22}-d_{12}/2$ and $d_2=d_{11}/2$ in the fourth type of sub-region; and
    wherein any two adjacent sub-regions in a same row are of different types, and any two adjacent sub-regions in a same column are of different types.

14. The display panel according to claim 1, wherein the transparent display region comprises at least two blocks, each of the at least two blocks comprises 6×6 sub-regions, and each of the at least two blocks comprises a fifth type of sub-region, a sixth type of sub-region, a seventh type of sub-region, an eighth type of sub-region, a ninth type of sub-region and a tenth type of sub-region, wherein $d_1=d_{12}/2$ and $d_2=d_{21}-d_{11}/2$ in the fifth type of sub-region, $d_1=d_{12}/2$ and $d_2=d_{21}/2$ in the sixth type of sub-region, $d_1=d_{12}/2$ and $d_2=d_{11}/2$ in the seventh type of sub-region, $d_1=d_{22}-d_{12}/2$ and $d_2=d_{21}-d_{11}/2$ in the eighth type of sub-region, $d_1=d_{22}-d_{12}/2$ and $d_2=d_{21}/2$ in the ninth type of sub-region, and $d_1=d_{22}-d_{12}/2$ and $d_2=d_{11}/2$ in the tenth type of sub-region; and
    wherein any two adjacent sub-regions in a same row are of different types, and any two adjacent sub-regions in a same column are of different types.

15. The display panel according to claim 1, wherein the display region further comprises a conventional display region and the transparent display region also serves as a photosensor disposing region.

16. The display panel according to claim 1, wherein all the display regions are transparent display regions.

17. A display device, comprising a display panel,
    wherein the display panel comprises a display region, wherein at least a portion of the display region is a transparent display region;
    wherein the transparent display region comprises a plurality of sub-regions, the plurality of sub-regions are arranged in an array and have a same shape and a same area, and a sub-region of the plurality of sub-regions comprises a first side and a second side which are adjacent to each other, wherein a first side of a sub-region also serves as a side of an adjacent sub-region in a first direction, and a second side of the sub-region also serves as a side of an adjacent sub-region in a second direction, the first direction intersects with the second direction, and the first direction intersects with the first side; and
    wherein the sub-region comprises a non-light-transmissive region and a light-transmissive region, light-transmissive regions in the plurality of sub-regions have a same shape, a distance between a center of the light-transmissive region and a first side of a sub-region where the light-transmissive region is located is $d_1$, a distance between the center of the light-transmissive region and a second side of the sub-region where the light-transmissive region is located is $d_2$, and at least two of the plurality of sub-regions have at least one of different $d_1$ or different $d_2$;
    wherein light-transmissive regions of the plurality of sub-regions have a same area;
    wherein each of the plurality of sub-regions and each of the light-transmissive regions are rectangular in shape, and at least two adjacent bezel regions of the sub-region comprise the non-light-transmissive region;
    wherein a first side of the light-transmissive region is adjacent to and parallel to the first side of the sub-region, the first side of the light-transmissive region has a length of $d_{11}$, the first side of the sub-region has a length of $d_{21}$, a second side of the light-transmissive region is adjacent to and parallel to the second side of the sub-region and has a length of $d_{12}$, and the second side of the sub-region has a length of $d_{22}$;
    wherein $d_{11}<d_{21}$, $d_{12}<d_{22}$, $d_{12}/2 \leq d_1 \leq d_{22}-d_{12}/2$, and $d_{11}/2 \leq d_2 \leq d_{21}-d_{11}/2$; and
    wherein $d_{21}-d_{11}<0.1\times d_{21}$, and $d_{22}-d_{12}<0.1\times d_{22}$;
    wherein a maximum difference value between $d_1$ in two sub-regions is $d_{1max}$, a maximum difference value between $d_2$ in two sub-regions is $d_{2max}$, the light-transmissive region in the sub-region has a maximum size of $D_1$ in the first direction, and the light-transmissive region in the sub-region has a maximum size of $D_2$ in the second direction; and
    wherein $d_{1max}<0.1\times D_2$, and $d_{2max}<0.1\times D_1$.

18. A display panel, comprising a display region, wherein at least a portion of the display region is a transparent display region;

wherein the transparent display region comprises a plurality of sub-regions, the plurality of sub-regions are arranged in an array and have a same shape and a same area, and a sub-region of the plurality of sub-regions comprises a first side and a second side which are adjacent to each other, wherein a first side of a sub-region also serves as a side of an adjacent sub-region in a first direction, and a second side of the sub-region also serves as a side of an adjacent sub-region in a second direction, the first direction intersects with the second direction, and the first direction intersects with the first side; and wherein the sub-region comprises a non-light-transmissive region and a light-transmissive region, light-transmissive regions in the plurality of sub-regions have a same shape, a distance between a center of the light-transmissive region and a first side of a sub-region where the light-transmissive region is located is $d_i$, a distance between the center of the light-transmissive region and a second side of the sub-region where the light-transmissive region is located is $d_2$, and at least two of the plurality of sub-regions have at least one of different $d_i$ or different $d_2$;

wherein the transparent display region is provided with a first film, at least one of the following cases exists for different light-transmissive regions: the first film has different thicknesses in the different light-transmissive regions, the first film is made of different materials in the different light-transmissive regions, or the first film comprises at least two sub-films that are stacked and have different thicknesses ratios in the different light-transmissive regions.

\* \* \* \* \*